(12) United States Patent
Shimizu

(10) Patent No.: US 12,412,634 B2
(45) Date of Patent: Sep. 9, 2025

(54) MULTI-BIT WRITING AND VERIFICATION IN SEMICONDUCTOR MEMORY DEVICE

(71) Applicant: KIOXIA CORPORATION, Tokyo (JP)

(72) Inventor: Takahiro Shimizu, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 179 days.

(21) Appl. No.: 17/682,255

(22) Filed: Feb. 28, 2022

(65) Prior Publication Data

US 2023/0072387 A1    Mar. 9, 2023

(30) Foreign Application Priority Data

Sep. 7, 2021    (JP) ................................. 2021-145658

(51) Int. Cl.
*G11C 16/34*    (2006.01)
*G11C 7/10*    (2006.01)
*G11C 16/08*    (2006.01)
*G11C 16/10*    (2006.01)
*G11C 16/24*    (2006.01)
*G11C 16/26*    (2006.01)

(52) U.S. Cl.
CPC .......... *G11C 16/3459* (2013.01); *G11C 7/106* (2013.01); *G11C 7/1087* (2013.01); *G11C 16/08* (2013.01); *G11C 16/102* (2013.01); *G11C 16/24* (2013.01); *G11C 16/26* (2013.01); *G11C 16/3404* (2013.01)

(58) Field of Classification Search
CPC ... G11C 16/3459; G11C 16/08; G11C 16/102; G11C 16/24; G11C 16/26; G11C 16/3404; G11C 16/0483; G11C 16/06; G11C 16/34; G11C 16/3427
See application file for complete search history.

(56) References Cited

U.S. PATENT DOCUMENTS

| 9,607,688 | B2 | 3/2017 | Kwak |
| 11,069,417 | B2 | 7/2021 | Yu et al. |
| 2006/0120162 | A1* | 6/2006 | Fujiu ................ G11C 16/0483 365/185.24 |
| 2018/0240515 | A1 | 8/2018 | Shibata et al. |
| 2018/0261291 | A1* | 9/2018 | Nagao .................... H10B 43/27 |
| 2021/0064295 | A1 | 3/2021 | Yu et al. |
| 2021/0223962 | A1 | 7/2021 | Esaka et al. |

FOREIGN PATENT DOCUMENTS

JP    2018-137006 A    8/2018

* cited by examiner

*Primary Examiner* — Alfredo Bermudez Lozada
(74) *Attorney, Agent, or Firm* — Kim & Stewart LLP

(57) ABSTRACT

A semiconductor memory device includes a memory string and a control circuit. The memory string includes a first memory cell connected to a first word line and a second memory cell adjacent to the first memory cell and connected to a second word line. The control circuit is configured to perform a multi-bit-data writing with respect to each of the first and second memory cells. The multi-bit-data writing includes, in order, a first programming to program the first memory cell, the first programming with respect to the second memory cell, a reading of first data from the first memory cell, a second programming to program the second memory cell, and a verification of data programmed in the second memory cell. The control circuit is configured to set a verify voltage to be applied to the second word line during the verification based on the first data.

8 Claims, 23 Drawing Sheets

| WL# | | SU0 | SU1 | SU2 | SU3 | SU4 |
|---|---|---|---|---|---|---|
| 2 | QLC | | | | | |
| | MLC | [16] | | | | |
| 1 | QLC | [17] | | | | |
| | MLC | [6] | [8] | [10] | [12] | [14] |
| 0 | QLC | [7] | [9] | [11] | [13] | [15] |
| | MLC | [1] | [2] | [3] | [4] | [5] |

| DATA TO BE STORED | WL(n+1)=Er | WL(n+1)=A/B/C |
|---|---|---|
| WL(n-1)=Er | 1 | 0 |
| WL(n-1)=A/B/C | 0 | 0 |

FIG. 31

| LOOP | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| S1 | ◌ | ○ | ○ | ○ | ○ | ○ | ○ | ○ |   |   |   |   |   |   |   |   |   |   |   |
| S2 |   |   | ◌ | ○ | ○ | ○ | ○ | ○ | ○ | ○ | ○ |   |   |   |   |   |   |   |   |
| S3 |   |   |   | ◌ | ○ | ○ | ○ | ○ | ○ | ○ | ○ | ○ |   |   |   |   |   |   |   |
| S4 |   |   |   |   | ◌ | ○ | ○ | ○ | ○ | ○ | ○ | ○ | ○ | ○ |   |   |   |   |   |
| S5 |   |   |   |   |   |   | ◌ | ○ | ○ | ○ | ○ | ○ | ○ | ○ | ○ | ○ |   |   |   |
| S6 |   |   |   |   |   |   |   |   | ◌ | ○ | ○ | ○ | ○ | ○ | ○ | ○ | ○ |   |   |
| S7 |   |   |   |   |   |   |   |   |   | ◌ | ○ | ○ | ○ | ○ | ○ | ○ | ○ | ○ | ○ |
| S8 |   |   |   |   |   |   |   |   |   |   |   | ◌ | ○ | ○ | ○ | ○ | ○ | ○ | ○ |
| S9 |   |   |   |   |   |   |   |   |   |   |   |   |   | ◌ | ○ | ○ | ○ | ○ | ○ |
| S10 |   |   |   |   |   |   |   |   |   |   |   |   |   |   |   | ◌ | ○ | ○ | ○ |
| S11 |   |   |   |   |   |   |   |   |   |   |   |   |   |   |   |   |   | ◌ | ○ |
| S12 |   |   |   |   |   |   |   |   |   |   |   |   |   |   |   |   |   |   |   |
| S13 |   |   |   |   |   |   |   |   |   |   |   |   |   |   |   |   |   |   |   |
| S14 |   |   |   |   |   |   |   |   |   |   |   |   |   |   |   |   |   |   |   |
| S15 |   |   |   |   |   |   |   |   |   |   |   |   |   |   |   |   |   |   |   |

MULTI-BIT WRITING AND VERIFICATION IN SEMICONDUCTOR MEMORY DEVICE

CROSS-REFERENCE TO RELATED APPLICATION(S)

This application is based upon and claims the benefit of priority from Japanese Patent Application No. 2021-145658, filed Sep. 7, 2021, the entire contents of which are incorporated herein by reference.

FIELD

Embodiments described herein relate generally to a semiconductor memory device.

BACKGROUND

There is a method of writing multi-bit data in each memory cell of a semiconductor memory device by performing a write operation (a write sequence) multiple times. The time necessary for writing the multi-bit data using such a method may be unacceptably long. Further, when the multi-bit data is written, time necessary for reading data from each memory cell of the semiconductor memory device may also be unacceptably long.

BRIEF DESCRIPTION OF THE DRAWINGS

FIG. 31 is a diagram illustrating a relationship between a loop for a write operation and a state targeted for a verify operation in the second embodiment.

DETAILED DESCRIPTION

Embodiments provide a semiconductor memory device directed to reducing time for a read or write operation.

In general, according to an embodiment, a semiconductor memory device includes a memory string and a control circuit. The memory string includes a first memory cell connected to a first word line and a second memory cell adjacent to the first memory cell and connected to a second word line. The control circuit is configured to perform a multi-bit-data writing with respect to each of the first and second memory cells. The multi-bit-data writing includes, in order, a first programming to program the first memory cell, the first programming with respect to the second memory cell, a reading of first data from the first memory cell, a second programming to program the second memory cell, and a verification of data programmed in the second memory cell. The control circuit is configured to set a verify voltage to be applied to the second word line during the verification based on the first data read from the first memory cell.

Hereinafter, embodiments of the present disclosure will be described with reference to the drawings.

First Embodiment (Configuration of Memory System)

Figure 1:
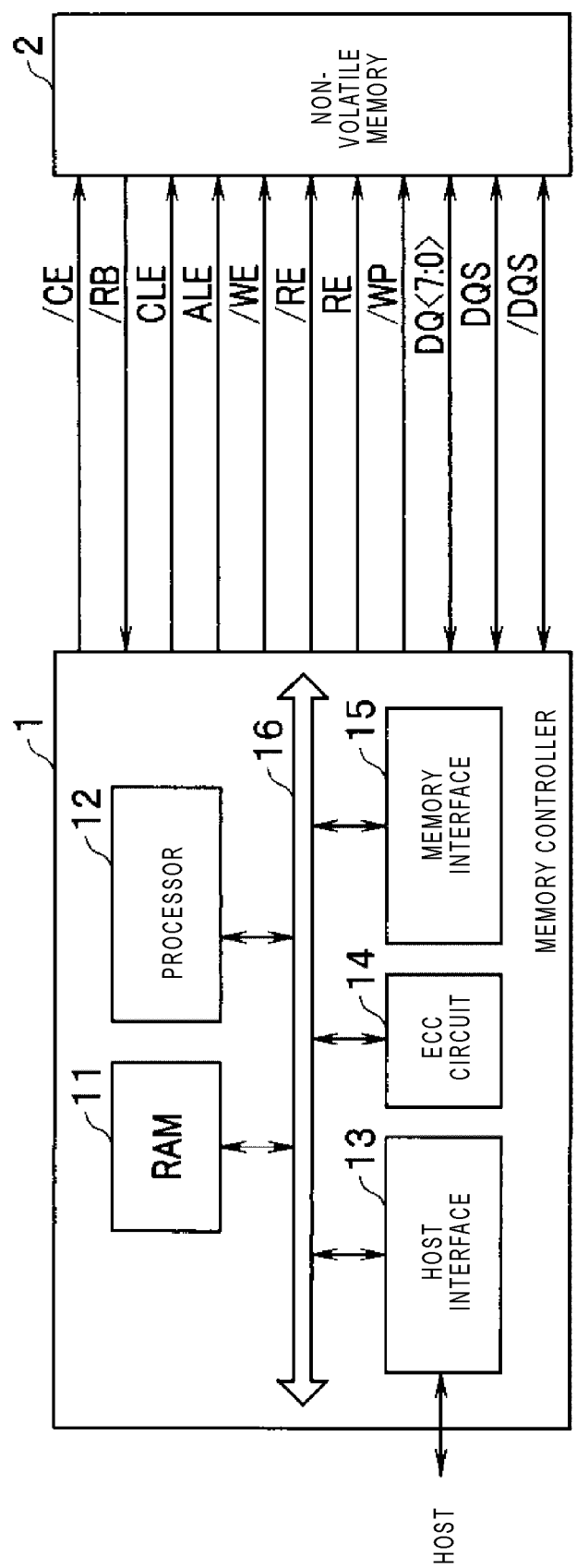
FIG. 1 is a block diagram illustrating an example of a configuration of a memory system according to a first embodiment.

FIG. 1 is a block diagram illustrating an example of a configuration of a memory system according to an embodiment of the present disclosure. The memory system of the present embodiment includes a memory controller 1 and a nonvolatile memory 2, which is a semiconductor memory device. The memory system may be connected to a host. The host is, for example, an electronic device such as a personal computer or a mobile terminal.

The nonvolatile memory 2 stores data in a nonvolatile manner, and includes, for example, a NAND memory (a NAND type flash memory). The nonvolatile memory 2 is, for example, a NAND memory having a memory cell capable of storing 4 bits per memory cell transistor (hereinafter, also referred to as a memory cell), that is, a 4 bits/cell (QLC: quad level cell) NAND memory.

The memory controller 1 controls a writing of data to the nonvolatile memory 2 according to a write request from the host. Further, the memory controller 1 controls a reading of data from the nonvolatile memory 2 according to a read request from the host. Signals such as a chip enable signal /CE, a ready busy signal /RB, a command latch enable signal CLE, an address latch enable signal ALE, a write enable signal /WE, read enable signals RE and /RE, a write protect signal /WP, a signal DQ<7:0> which is data, and data strobe signals DQS and /DQS are transmitted and received between the memory controller 1 and the nonvolatile memory 2.

For example, each of the nonvolatile memory 2 and the memory controller 1 is formed as a semiconductor chip (hereinafter, also simply referred to as a "chip").

The chip enable signal /CE is a signal for enabling the nonvolatile memory 2. The ready busy signal /RB is a signal for indicating whether the nonvolatile memory 2 is in a ready state (e.g., a state of receiving a command from the outside) or a busy state (e.g., a state of not receiving a command from the outside). The command latch enable signal CLE is a signal for indicating that the signal DQ<7:0> is a command. The address latch enable signal ALE is a signal for indicating that the signal DQ<7:0> is an address. The write enable signal /WE is a signal for introducing a received signal into the nonvolatile memory 2, and is asserted each time the memory controller 1 receives a command, an address, and data. The signal /WE instructs the nonvolatile memory 2 to introduce the signal DQ<7:0> while the signal /WE is at a "L (Low)" level.

The read enable signals RE and /RE are signals for enabling the memory controller 1 to read data from the nonvolatile memory 2. For example, the signals RE and /RE are used for controlling an operation timing of the nonvolatile memory 2 when the signal DQ<7:0> is output. The write protect signal /WP is a signal for instructing inhibition of data writing or erasing to the nonvolatile memory 2. The signal DQ<7:0> is data transmitted/received between the nonvolatile memory 2 and the memory controller 1, and includes a command, an address, and data. The data strobe signals DQS and /DQS are signals for controlling an input/output timing of the signal DQ<7:0>.

The memory controller 1 includes a random access memory (RAM) 11, a processor 12, a host interface 13, an error checking and correction (ECC) circuit 14, and a memory interface 15. The RAM 11, the processor 12, the host interface 13, the ECC circuit 14, and the memory interface 15 are connected to each other by an internal bus 16.

The host interface 13 outputs a request, user data (may be referred to as write data) or the like received from the host, to the internal bus 16. Further, the host interface 13 transmits user data read from the nonvolatile memory 2, a response from the processor 12 and others, to the host.

The memory interface 15 controls a process of writing user data or the like to the nonvolatile memory 2 and a process of reading data from the nonvolatile memory 2, based on an instruction of the processor 12.

The processor 12 comprehensively controls the memory controller 1. The processor 12 is, for example, a central processing unit (CPU), a micro processing unit (MPU) or the like. When a request is received from the host via the host interface 13, the processor 12 performs a control in accordance with the request. For example, the processor 12 instructs the memory interface 15 to write user data and parities to the nonvolatile memory 2 in accordance with a request from the host. Further, the processor 12 instructs the memory interface 15 to read user data and parities from the nonvolatile memory 2 in accordance with a request from the host.

The processor 12 determines a storage area (a memory area) of the nonvolatile memory 2 for user data stored in the RAM 11. The user data is stored in the RAM 11 via the internal bus 16. The processor 12 determines the storage area for data in units of a page (page data) which is a writing unit. In the descriptions herein, user data stored in one page of the nonvolatile memory 2 are defined as unit data. In general, the unit data is encoded, and stored as a codeword in the nonvolatile memory 2. In the present embodiment, the encoding may not necessarily be performed. While the memory controller 1 may store the unit data in the nonvolatile memory 2 without encoding the unit data, FIG. 1 illustrates a configuration in which the encoding is performed, as an example. When the memory controller 1 does not perform the encoding, the page data matches the unit data. Further, one codeword may be generated based on one unit data, or one codeword may be generated based on divided data obtained by dividing the unit data. Further, one codeword may be generated using multiple unit data.

The processor 12 determines a storage area of the nonvolatile memory 2 as a writing destination, for each unit data. A physical address is allocated to each storage area of the nonvolatile memory 2. The processor 12 manages the storage area which is the writing destination of the unit data, by using the physical address. The processor 12 instructs the memory interface 15 to write user data to the nonvolatile memory 2 while designating the determined storage area (physical address). The processor 12 manages a correspondence between a logical address (managed by the host) and a physical address of user data. When a read request including a logical address is received from the host, the processor 12 specifies a physical address that corresponds to the logical address, and instructs the memory interface 15 to read the user data, by designating the physical address.

The ECC circuit 14 encodes the user data stored in the RAM 11 to generate a codeword. Further, the ECC circuit 14 decodes a codeword read from the nonvolatile memory 2.

The RAM 11 temporarily stores user data received from the host until storing the user data in the nonvolatile memory 2, or temporarily stores data read from the nonvolatile memory 2 until transmitting the data to the host. The RAM 11 is, for example, a general-purpose memory such as a static random access memory (SRAM) or a dynamic random access memory (DRAM).

FIG. 1 illustrates an example of a configuration in which the memory controller 1 includes the ECC circuit 14 and the memory interface 15 as separate components. Alternatively, the ECC circuit 14 may be built in the memory interface 15. Further, the ECC circuit 14 may be built in the nonvolatile memory 2.

When a write request is received from the host, the memory system operates as follows. The processor 12 temporarily stores data to be written, in the RAM 11. The processor 12 reads the data stored in the RAM 11, and inputs the read data to the ECC circuit 14. The ECC circuit 14 encodes the input data, and inputs the obtained codeword to the memory interface 15. The memory interface 15 writes the input codeword to the nonvolatile memory 2.

When a read request is received from the host, the memory system operates as follows. The memory interface 15 inputs a codeword read from the nonvolatile memory 2 to the ECC circuit 14. The ECC circuit 14 decodes the input codeword, and stores the decoded data in the RAM 11. The processor 12 transmits the data stored in the RAM 11 to the host via the host interface 13.

(Configuration of Nonvolatile Memory)

Figure 2:
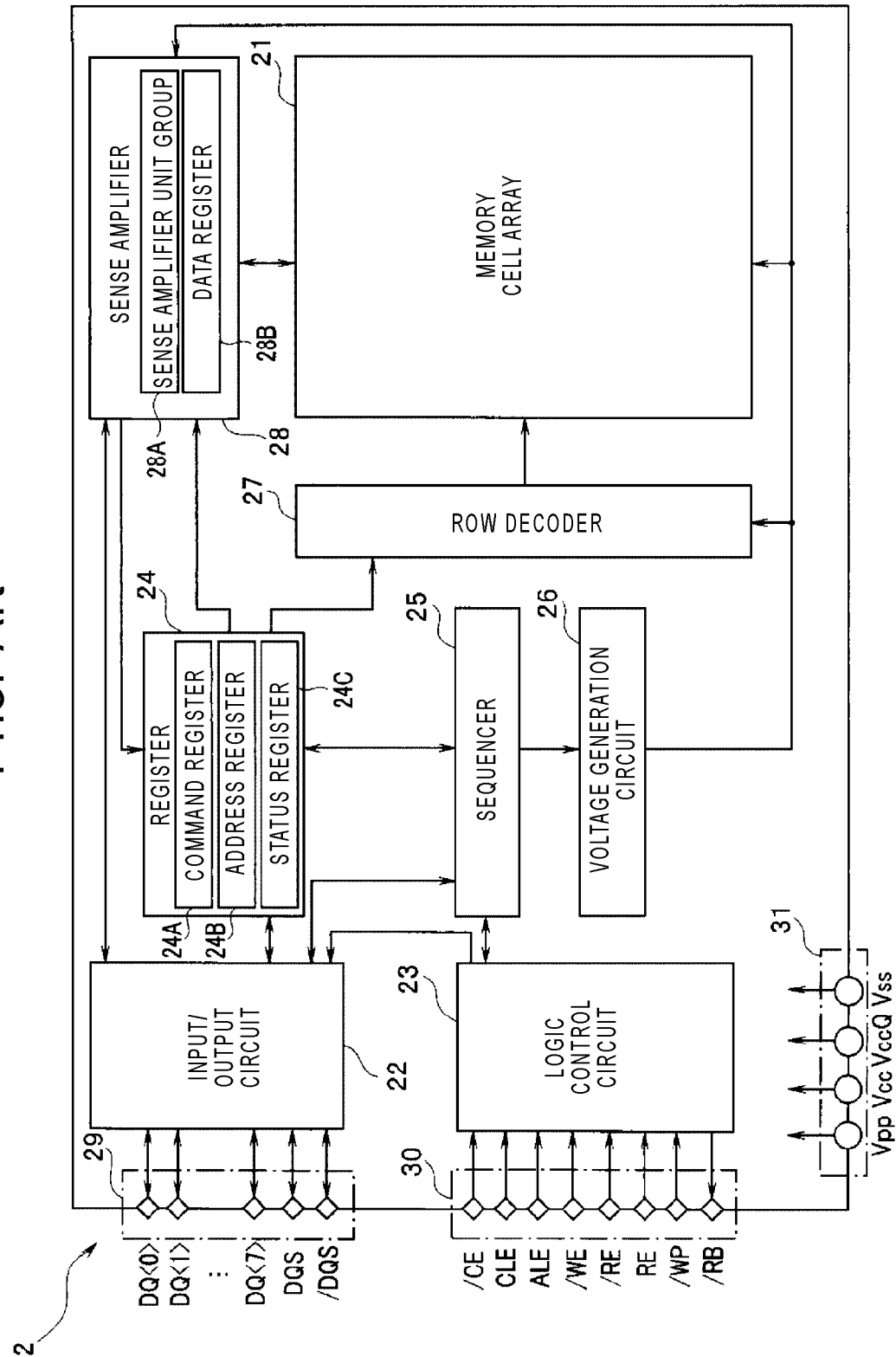
FIG. 2 is a block diagram illustrating an example of a configuration of a nonvolatile memory according to the first embodiment.

FIG. 2 is a block diagram illustrating an example of a configuration of a nonvolatile memory according to the present embodiment. The nonvolatile memory 2 includes a memory cell array 21, an input/output circuit 22, a logic control circuit 23, a register 24, a sequencer 25, a voltage generation circuit 26, a row decoder 27, a sense amplifier 28, an input/output pad group 29, a logic control pad group 30, and a power input terminal group 31.

The memory cell array 21 includes multiple nonvolatile memory cells (not illustrated) associated with word lines and bit lines. Each memory cell is associated with a row and a column. The memory cell array 21 includes multiple blocks BLK. The memory cell array 21 includes multiple memory cells. As described below, each memory cell is capable of storing n-bit data ("n" is an integer of 2 or more) per memory cell.

The input/output circuit 22 transmits/receives the signal DQ<7:0> and the data strobe signals DQS and /DQS to/from the memory controller 1. The input/output circuit 22 transfers a command and an address in the signal DQ<7:0> to the register 24. Further, the input/output circuit 22 transmits/receives write data and read data to/from the sense amplifier 28.

The logic control circuit 23 receives the chip enable signal /CE, the command latch enable signal CLE, the address latch enable signal ALE, the write enable signal /WE, the read enable signals RE and /RE, and the write protect signal /WP, from the memory controller 1. Further, the logic control circuit 23 transfers the ready busy signal /RB to the memory controller 1, to notify the state of the nonvolatile memory 2 to the outside.

The register 24 stores commands, addresses, and statuses. More specifically, the register 24 includes a command register 24A, an address register 24B, and a status register 24C, which store commands, addresses and statuses, respectively.

The sequencer 25 is a control circuit that controls the operation of the entire nonvolatile memory 2 based on the commands stored in the command register 24A.

The voltage generation circuit 26 generates voltages necessary for operations such as, for example, a data writing, a data reading, and a data erasing, based on an instruction from the sequencer 25.

The row decoder 27 receives a block address and a row address included in an address from the address register 24B, and selects a corresponding block based on the block address and a corresponding word line based on the row address.

During a data reading, the sense amplifier 28 senses data read from a memory cell into a bit line, and transfers the sensed read data to the input/output circuit 22. During a data writing, the sense amplifier 28 transfers write data written via a bit line, to a memory cell. More specifically, the sense amplifier 28 includes a sense amplifier unit group 28A and a data register 28B. During the data reading, read data read by the sense amplifier unit group 28A is stored in the data register 28B. During the data writing, write data stored in the data register 28B is transferred to the sense amplifier unit group 28A, and the sense amplifier unit group 28A transfers the write data to a memory cell via a bit line.

The input/output pad group 29 includes multiple terminals (e.g., pads) that correspond to the signal DQ<7:0> and the data strobe signals DQS and /DQS, respectively, in order to transmit/receive each signal including data to/from the memory controller 1.

The logic control pad group 30 includes multiple terminals (e.g., pads) that correspond to the chip enable signal /CE, the command latch enable signal CLE, the address latch enable signal ALE, the write enable signal /WE, the read enable signals RE and /RE, and the write protect signal /WP, respectively, in order to transmit/receive each signal to/from the memory controller 1.

The power input terminal group 31 includes multiple terminals for inputting power voltages Vcc, VccQ, and Vpp and a ground voltage Vss, respectively, in order to supply various operation powers to the nonvolatile memory 2 from the outside. The power voltage Vcc is a circuit power voltage generally supplied from the outside as an operation power, and for example, a voltage of about 3.3 V is input. As for the power voltage VccQ, for example, a voltage of 1.2 V is input. The power voltage VccQ is used when signals are transmitted/received between the memory controller 1 and the nonvolatile memory 2. The power voltage Vpp is higher than the power voltage Vcc, and for example, a voltage of 12 V is input. When data is written to the memory cell array 21 or data is erased, a relatively high voltage of about 20 V is required. At this time, by boosting the power voltage Vpp of about 12 V using a voltage boosting circuit of the voltage generation circuit 26, rather than boosting the power voltage Vcc of about 3.3 V, a desired voltage may be generated at a relatively high speed with a low power consumption. Meanwhile, for example, when the nonvolatile memory 2 is used in an environment where a high voltage may not be supplied, a voltage may not be supplied to the power voltage Vpp. Even when the power voltage Vpp is not supplied, the nonvolatile memory 2 may execute various operations as long as the power voltage Vcc is supplied. That is, the power voltage Vcc is a power supplied to the nonvolatile memory 2 as a standard voltage, and the power voltage Vpp is a power that is additionally and optionally supplied according to, for example, a usage environment.

(Configuration of NAND Memory Cell Array)

Figure 3:
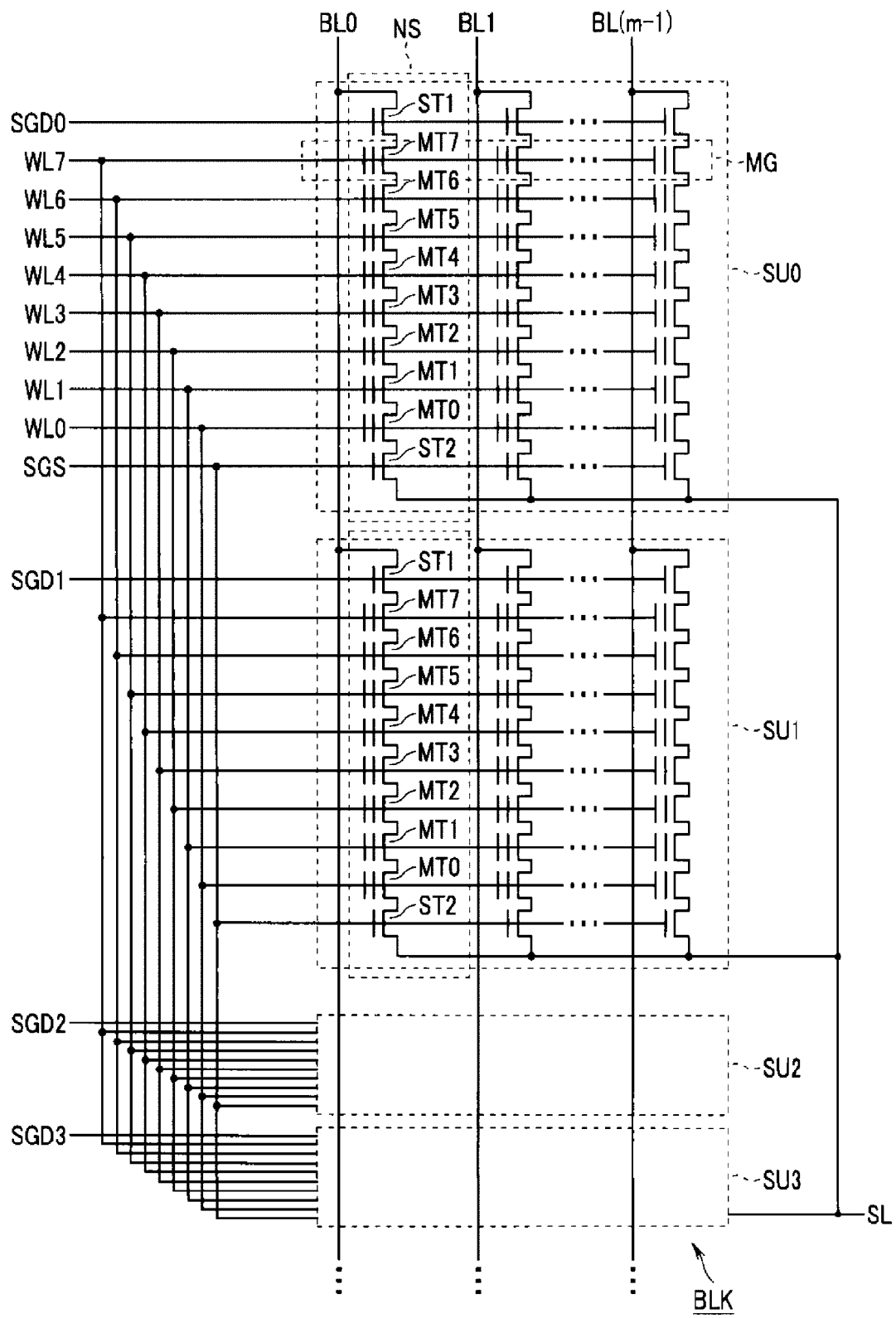
FIG. 3 is a diagram illustrating an example of a configuration of a block of a three-dimensional memory cell array in the nonvolatile memory according to the first embodiment.

FIG. 3 is a diagram illustrating an example of a configuration of a block of the memory cell array 21 having a three-dimensional structure. FIG. 3 illustrates one block BLK among the multiple blocks of the memory cell array 21 having the three-dimensional structure. The other blocks of the memory cell array 21 have the same configuration as that in FIG. 3. Further, the present embodiment is also applicable to a memory cell array having a two-dimensional structure.

As illustrated, the block BLK includes, for example, four string units (SU0 to SU3). Each string unit SU includes multiple NAND strings NS. Each NAND string NS includes eight memory cells MT (MT0 to MT7) and select transistors ST1 and ST2, in this example. The number of memory cells MT of the NAND string NS is eight in this example, but may be, for example, 32, 48, 64, or 96 without being limited to eight. While each of the select transistors ST1 and ST2 is represented as one transistor on an electrical circuit, the select transistors ST1 and ST2 may be the same as the memory cell transistors in view of a structure. Further, for example, in order to improve a cutoff characteristic, multiple select transistors may be used for each of the select transistors ST1 and ST2. Further, a dummy cell transistor may be provided between the memory cells MT and the select transistors ST1 and ST2.

The multiple memory cells MT are connected in series between the select transistors ST1 and ST2. The memory cell MT7 at one end of the multiple memory cells MT is connected to the select transistor ST1, and the memory cell MT0 at the other end of the multiple memory cells MT is connected to the select transistor ST2.

The gates of the select transistors ST1 of the respective string units SU0 to SU3 are connected to select gate lines SGD0 to SGD3, respectively. Meanwhile, the gates of the select transistors ST2 are commonly connected to the same select gate line SGS among the multiple string units SU of the same block BLK. Further, the gates of the memory cells MT0 to MT7 in the same block BLK are commonly connected to word lines WL0 to WL7, respectively. That is, while the word lines WL0 to WL7 and the select gate line SGS are connected in common throughout the multiple string units SU0 to SU3 of the same block BLK, the select gate lines SGD are independent for the respective string units SU0 to SU3 even in the same block BLK.

The word lines WL0 to WL7 are connected to the gates of the memory cells MT0 to MT7, respectively, in the NAND string NS. The gates of memory cells MTi in the same row of the block BLK are connected to the same word line WLi. In the descriptions herein below, the NAND string NS may be simply referred to as a "string" or "memory string".

Each NAND string NS is connected to a corresponding bit line. Accordingly, each memory cell MT is connected to the bit line via a select transistor ST or another memory cell MT of the NAND string NS. As described above, data of the memory cells MT in the same block BLK are collectively erased. Meanwhile, reading and writing of data are performed in units of a memory cell group MG (or a page). In the descriptions herein, the multiple memory cells MT connected to one word line WLi and belonging to one string unit SU are defined as one memory cell group MG. In the present embodiment, the nonvolatile memory 2 is a quad level cell (QLC) NAND memory capable of storing 4-bit (16-value) data. Accordingly, one memory cell group MG is capable of storing data that correspond to four pages. The one of four bits stored in the memory cells MT of one memory cell group MG corresponds to one of the four pages.

Figure 4:
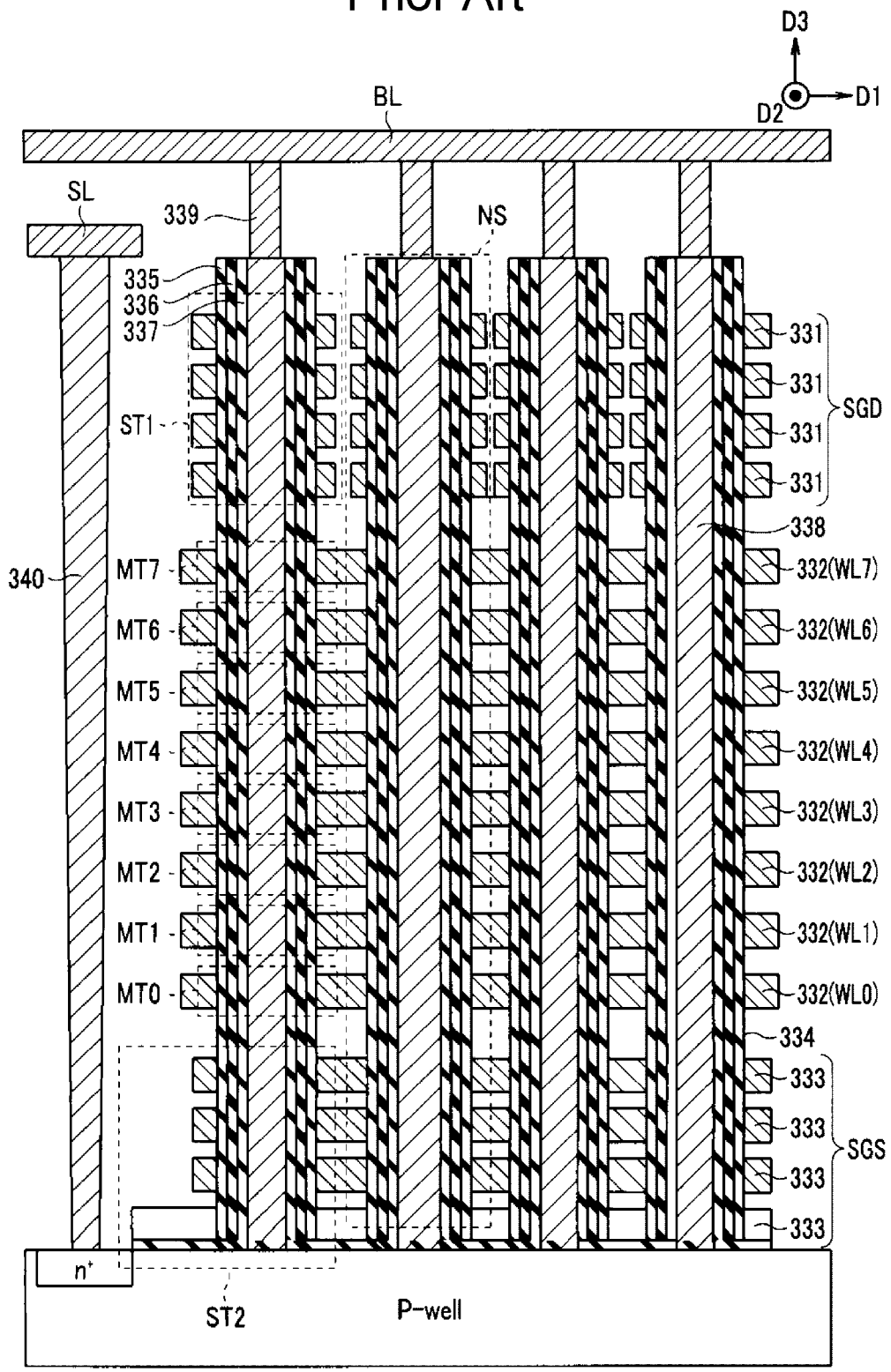
FIG. 4 is a cross-sectional diagram illustrating a partial area of the three-dimensional NAND memory cell array.

FIG. 4 is a cross-sectional diagram illustrating a partial area of the three-dimensional NAND memory cell array. As illustrated in FIG. 4, the multiple NAND strings NS are formed on a p-type well area (P-well). That is, multiple wiring layers 333 that function as the select gate line SGS, multiple wiring layers 332 that each function as the word line WLi, and multiple wiring layers 331 that function as the select gate line SGD are stacked on the p-type well area.

Further, a memory hole 334 is formed to penetrate the wiring layers 333, 332, and 331 and reach the p-type well area. A block insulating film 335, a charge storage film (charge storing area) 336, and a gate insulating film 337 are formed in an order on the side surface of the memory hole 334, and a conductor column 338 is embedded in the memory hole 334. The conductor column 338 is made of, for example, polysilicon, and functions as an area where a channel is formed during the operations of the memory cells MT and the select transistors ST1 and ST2 in the NAND string NS. That is, the wiring layers 331, the conductor column 338, and the films 335 to 337 between the wiring layers 331 and the conductor column 338 function as the select transistor ST1. The wiring layers 332, the conductor column 338, and the films 335 to 337 between the wiring layers 332 and the conductor column 338 function as the memory cells MT. The wiring layers 333, the conductor column 338, and the films 335 to 337 between the wiring layers 333 and the conductor column 338 function as the select transistor ST2.

In each NAND string NS, the select transistor ST2, the multiple memory cells MT, and the select transistor ST1 are formed in this order on the p-type well area. A wiring layer is formed above the conductor column 338 to function as the bit line BL. A contact plug 339 is formed on the upper end of the conductor column 338 to connect the conductor column 338 and the bit wire BL to each other.

Further, an n$^+$ type impurity diffusion layer and a p$^+$ type impurity diffusion layer are formed in the surface of the p-type well area. A contact plug 340 is formed on the n$^+$ type impurity diffusion layer, and a wiring layer is formed on the contact plug 340 to function as a source line SL.

The configuration illustrated in FIG. 4 is arranged in plurality in a depth direction of the paper surface of FIG. 4, and one string unit SU is formed by a set of the multiple NAND strings arranged in a row in the depth direction.

(Threshold Voltage Distributions)

Figure 5:
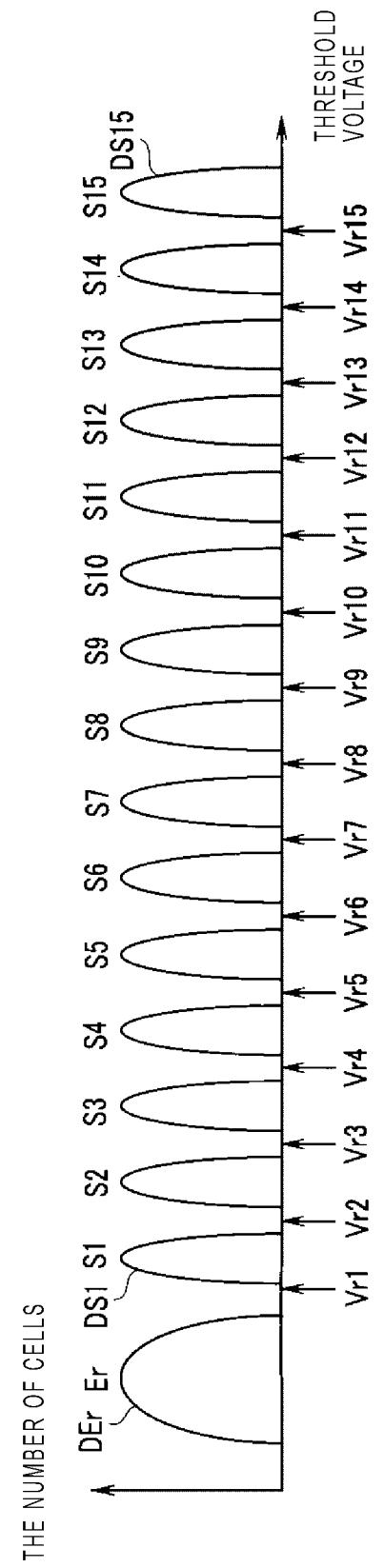
FIG. 5 is a diagram illustrating threshold voltage distributions of a memory cell according to the first embodiment.

FIG. 5 is a diagram illustrating threshold voltage distributions of a memory cell (memory cell transistor). FIG. 5 illustrates an example of threshold voltage distributions of the 4-bit/Cell nonvolatile memory 2. In the nonvolatile memory 2, a threshold voltage of a memory cell MT is set according to each data value of multi-bit data (here, 4 bits) to be stored in the memory cell MT. That is, each memory cell MT is capable of storing n-bit data ("n" is an integer of 2 or more), and a threshold voltage corresponding to each data value is set in each memory cell MT. Since injection of electronic charges into a charge storage film (a charge storing area) is probabilistic in amount, the threshold voltage of each memory cell MT is also statistically distributed as illustrated in FIG. 5.

As described below, the 4 bits correspond to data of a lower (level) page, a middle (level) page, an upper (level) page, and a top (level) page.

Further, in the present embodiment, the writing of data is performed in two steps. The sequencer 25 may execute a first write operation for writing data of "p" bits of the "n" bits (p<n) to each memory cell (an MLC write operation to be described below), and a second write operation for additionally writing data of (n-p) bits to each memory cell after the first write operation (a QLC write operation to be described below), so as to write the n-bit data. For the second write operation (the QLC write operation), the sequencer 25 executes a program operation for writing the n-bit data and a verify operation for verifying the n-bit data written through the program operation.

In the present embodiment, 2-bit data of the lower and middle pages are written during the first write operation, and 2-bit data of the upper and top pages are additionally written during the second write operation, so that the 4-bit data are written. FIG. 5 illustrates threshold voltage distributions of the memory cell MT after the data of the upper and top pages are written. As described below, data that correspond to any of four levels Er, A, B, and C corresponding to four threshold voltage distributions are written to each memory cell MT during the first write operation. That is, data that correspond to any of the four levels Er, A, B, and C corresponding to the four threshold voltage distributions for the 2-bit data are written to each memory cell MT, during the first write operation. Through the second write operation, data that correspond to any of 16 states Er, S1, . . . , and S15 corresponding to 16 threshold voltage distributions for the 4-bit data are written to each memory cell MT.

In FIG. 5, the horizontal axis represents a threshold voltage Vth, and the vertical axis represents the number of memory cells (the number of cells), in which threshold voltage distributions are expressed as 16 mountain-shaped areas of DEr, DS1, DS2, DS3, . . . , DS13, DS14, and DS15, and the width of the threshold voltage of each area corresponds to each target area. In the example of FIG. 5, by setting the threshold voltage of the memory cell MT to any of the 16 target areas, data of 16 values (4-bit data) may be stored in the memory cell MT.

In the present embodiment, the target area where the threshold voltage Vth becomes equal to or less than a voltage Vr1 of FIG. 5 will be referred to as a state Er, the target area where the threshold voltage becomes larger than the voltage Vr1 and equal to or less than a voltage Vr2 will be referred to as a state S1, and the target area where the threshold voltage becomes larger than the voltage Vr2 and equal to or less than a voltage Vr3 will be referred to as a state S2, and the target area where the threshold voltage becomes larger than the voltage Vr3 and equal to or less than a voltage Vr4 will be referred to as a state S3. Similarly, as illustrated in FIG. 5, the states S4 to S15 are set according to each voltage.

That is, the state indicates a target area that corresponds to a data value to be stored in each memory cell MT, and the target areas for the 16 values of the four bits are classified into the 16 states Er and S1 to S15. Further, the threshold voltage distributions that correspond to the states Er, S1, S2, S3, . . . , S13, S14, and S15 will be referred to as distributions DEr, DS1, DS2, DS3, . . . , DS13, DS14, and DS15, respectively. The voltages Vr1 to Vr15 are reference voltages, which are boundaries of the respective target areas. In the verify operation, the voltages Vr1 to Vr15 are applied to the word lines WL as verify voltages, so as to sense the current flowing through the bit lines BL by the sense amplifier unit SAU. When it is determined that a target memory cell MT is OFF, it is determined that the voltage reaches the threshold voltage corresponding to the state.

(Sense Amplifier)

Next, the operation of the sense amplifier 28 during the read operation and the verify operation will be described.

Figure 6:
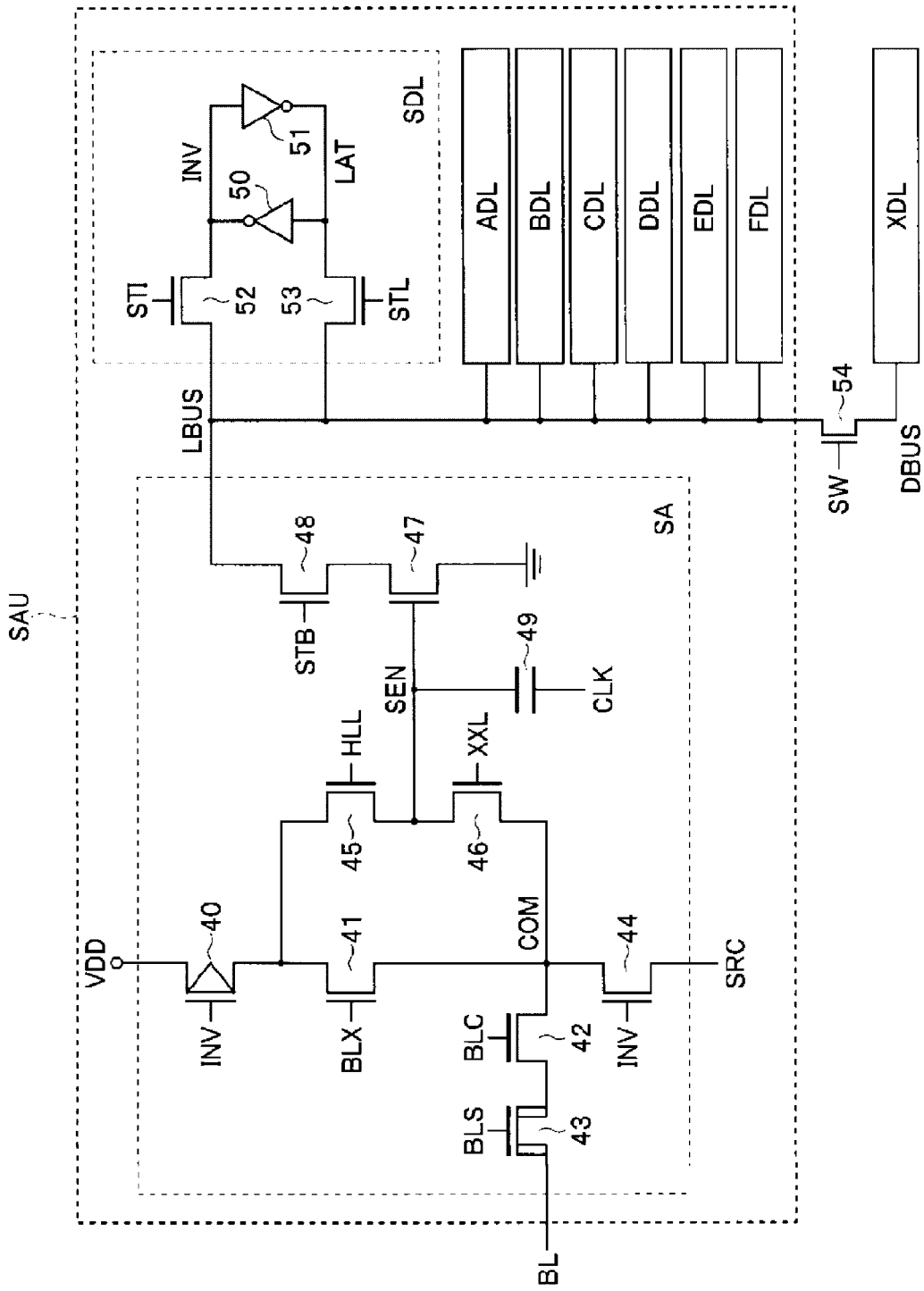
FIG. 6 is a circuit diagram illustrating an example of a specific configuration of one sense amplifier unit of a sense amplifier in the nonvolatile memory according to the first embodiment.

FIG. 6 is a circuit diagram illustrating an example of a specific configuration of one sense amplifier unit belonging to the sense amplifier unit group 28A (shown in FIG. 2), and one latch circuit XDL belonging to a corresponding data register 28B (shown in FIG. 2). The sense amplifier 28 includes the sense amplifier unit group 28A and the data register 28B as shown in FIG. 2. The sense amplifier unit group 28A includes multiple sense amplifier units SAU associated with the bit lines BL0 to BL(m−1), respectively. Further, the data register 28B includes multiple latch circuits XDL that correspond to the multiple sense amplifier units SAU, respectively. FIG. 6 illustrates a detailed circuit configuration of one sense amplifier unit SAU connected to one bit line BL, and one latch circuit XDL.

As illustrated in FIG. 6, the sense amplifier unit SAU includes a sense amplifier SA, and latch circuits SDL, ADL, BDL, CDL, DDL, EDL, and FDL. The sense amplifier SA and the latch circuits SDL, ADL, BDL, CDL, DDL, EDL, FDL, and XDL are connected to receive data from each other. Among the latch circuits, the latch circuits SDL, ADL, BDL, CDL, DDL, EDL, and FDL are connected to each other by a bus LBUS. The bus LBUS and the latch circuit XDL are connected to each other via a transistor 54 and a bus DBUS. The latch circuits SDL, ADL, BDL, CDL, DDL, EDL, FDL, and XDL temporarily store read data, write data, and various data to be described below. The latch circuit XDL is connected to the input/output circuit 22, and used for the input/output of data between the sense amplifier unit SAU and the sequencer 25. A control signal SW is input to the gate of the transistor 54. The control signal SW controls the connection and the disconnection between the buses LBUS and XBUS.

The data of the lower and middle pages are stored in the latch circuits ADL and BDL, respectively. The data of the high and top pages are stored in the latch circuits CDL and DDL, respectively. As described below, information on write data (threshold voltages) of adjacent memory cells MT is stored in the latch circuits EDL and FDL.

The latch circuits ADL, BDL, CDR, and DDL store the 4-bit data of the write data. The latch circuits EDL and FDL store information on threshold voltages of two adjacent memory cells MT as described below. When any one memory cell of a selected word line WLn is a memory cell MTa, the latch circuits EDL and FDL store information on a threshold voltage of an adjacent memory cell MTb (adjacent to the memory cell MTa) of an adjacent word line WL(n+1) and a threshold voltage of an adjacent memory cell MTc (adjacent to the memory cell MTa) of an adjacent word line WL(n−1) (information indicating whether the threshold voltages are the Er state), respectively. For example, when the latch circuit EDL stores data "1", it indicates that the threshold voltage of the adjacent memory cell MTb is the "Er" level.

The latch circuit SDL includes, for example, inverters 50 and 51, and n-channel MOS transistors 52 and 53. An input node of the inverter 50 and an output node of the inverter 51 are connected to a node LAT. An input node of the inverter 51 and an output node of the inverter 50 are connected to a node INV. Data of the nodes INV and LAT are stored by the inverters 50 and 51. The write data from the sequencer 25 are supplied to the node LAT. The data stored in the node INV are inverted data of the data stored in the node LAT.

One end of the drain source path of the transistor 52 is connected to the node INV, and the other end thereof is connected to the bus LBUS. Further, one end of the drain source path of the transistor 53 is connected to the node INV, and the other end thereof is connected to the bus LBUS. A control signal STL is input to the gate of the transistor 53, and a control signal STI is input to the gate of the transistor 52.

Since the circuit configuration of each of the latch circuits ADL, BDL, CDL, DDL, EDL, and XDL is the same as that of the latch circuit SDL, descriptions thereof will be omitted. Further, various control signals supplied to the sense amplifier unit SAU are given from the sequencer 25.

The sense amplifier SA includes, for example, a p-channel MOS transistor 40, n-channel MOS transistors 41 to 48, and a capacitor 49.

During the read operation, the sense amplifier SA senses data read into a corresponding bit line BL, and determines whether the read data is "0" or "1". Further, during the program operation, the sense amplifier SA sets a corresponding bit line BL to a voltage value corresponding to the data "0" or "1" to be written.

The transistors 40 to 44 of the sense amplifier SA are used in the program operation. The source•drain path of the transistor 40 and the drain source path of the transistor 41 are connected in series between a power line that supplies a voltage VDD which is an internal power voltage, and the node COM. Further, the drain source path of the transistor 44 is connected between the node COM and a node SRC that supplies the voltage Vss, which is a ground voltage. Further, the drain source path of the transistor 42 and the drain source path of the transistor 43 are connected in series between the node COM and the bit line BL.

The gates of the transistors 40 and 44 are connected to the node INV. Thus, when the node LAT is at a low level (hereinafter, also referred to as "L") in accordance with the data "0", the node INV is maintained at a high level (hereinafter, also referred to as "H"), the transistor 40 is turned OFF, and the transistor 44 is turned ON. Meanwhile, when the node LAT is at "H" in accordance with the data "1", the node INV is maintained at "L", the transistor 40 is turned ON, and the transistor 44 is turned OFF.

During the program operation, control signals HLL and XXL supplied to the gates of the transistors 45 and 46, respectively, are at "L", and the transistors 45 and 46 are turned OFF. A control signal supplied to the transistor 41 enters "H", and the transistor 41 is turned ON. Further, during a normal program operation, the transistors 42 and 43 are conducted by control signals BLC and BLS.

Accordingly, when data "0" is stored in the node LAT, the transistor 40 is turned OFF, and the transistor 44 is turned ON, so that a bit line voltage Vbl_L such as the voltage Vss (e.g., 0 V) from the node SRC is supplied to the bit line BL. Further, when data "1" is stored in the node LAT, the transistor 40 is turned ON, and the transistor 44 is turned OFF, so that a bit line voltage Vbl_H of, for example 2.5 V is supplied to the bit line BL according to the control signals BLC and BLS given to the transistors 42 and 43.

All of the transistors 40 to 48 and the capacitor 49 of the sense amplifier SA are used in the verify operation. The drain source path of the transistor 45 and the drain source path of the transistor 46 are connected in series between the drain of the transistor 40 and the node COM. Further, the drain source path of the transistor 48 and the drain source path of the transistor 47 are connected in series between the bus LBUS and a reference voltage point. The source of the transistor 45 and the drain of the transistor 46 are connected to a sense node SEN, and the sense node SEN is connected to the gate of the transistor 47. The control signals HLL and XXL, the voltage of the sense node SEN, or a control signal STB are applied to the gates of the transistors 45 to 48, respectively. A clock CLK is applied to the sense node SEN via the capacitor 49.

Figure 7:
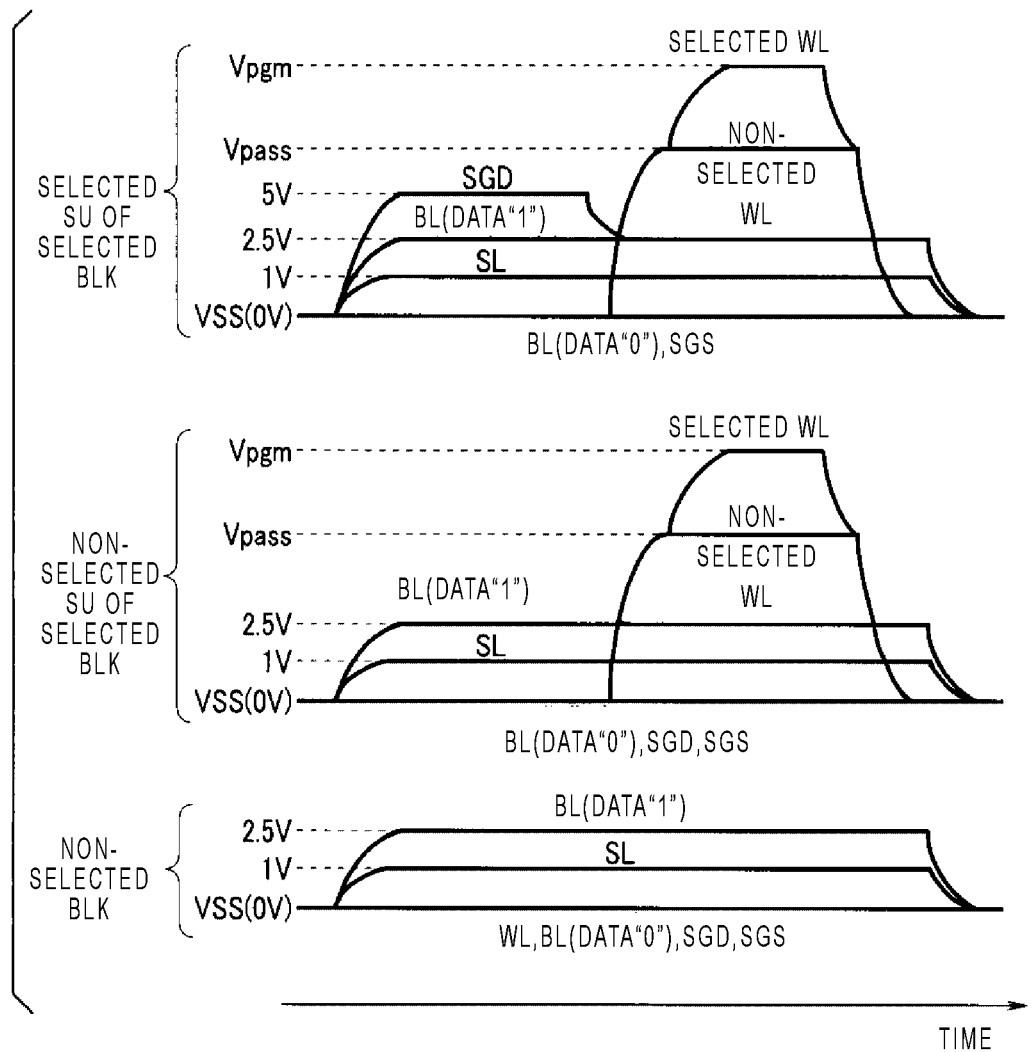
FIG. 7 is a diagram illustrating a voltage variation of each wire during a write operation in the first embodiment.

FIG. 7 is a diagram illustrating a voltage variation of each wire during the write operation. More specifically, FIG. 7 illustrates the voltage variation of each wire during the program operation as part of the write operation. The program operation is performed according to a program voltage and a bit line voltage which are applied to a word line and a bit line. A block BLK where no voltage is applied to word lines (selected WL and non-selected WL in FIG. 7) is a non-selected block BLK, which is not a writing target (the lowest portion of FIG. 7). Further, since the bit line voltage is applied to the memory cells MT when the select transistor ST1 connected to the bit line BL is conducted, a string unit SU to which the voltage of the select gate line SGD is not applied in the block BLK of a writing target (the selected block BLK) is a non-selected SU, which is not a writing target (the middle portion of FIG. 7). Even in the non-selected SU of the selected block BLK (the middle portion of FIG. 7), the select gate line SGD may be set to, for example, 5 V to conduct the select transistor ST1 before the program voltage Vpgm is applied.

As for a string unit SU of a writing target (selected SU) in the block BLK of a writing target (selected block BLK) (the upper portion of FIG. 7), the select gate line SGD is set to, for example, 5 V to conduct the select transistor ST1 before the program voltage Vpgm is applied, as illustrated in the left side of the upper portion of FIG. 7). Further, during the program operation, the select gate line SGS is, for example, 0 V. Accordingly, the select transistor ST2 enters the OFF state. Meanwhile, when the program voltage Vpgm is applied as illustrated in the right side of the upper portion of FIG. 7, the select gate line SGD is set to, for example, 2.5 V. As a result, the conduction or non-conduction state of the select transistor ST1 is determined by the bit line voltage of the bit line BL connected to the select transistor ST1.

As described above, the sense amplifier 28 transfers data to each bit line BL. The ground voltage Vss of, for example, 0 V is applied as the bit line voltage Vbl_L to a bit line BL, which corresponds to data "0". A write inhibition voltage Vinhibit (e.g., 2.5 V) is applied as the bit line voltage Vbl_H to a bit line BL, which corresponds to data "1". Thus, when the program voltage Vpgm is applied, the select transistor ST1 connected to the bit line BL corresponding to the data "0" is conducted, and the select transistor ST1 connected to the bit line BL corresponding to the data "1" is cut OFF. The memory cell MT connected to the cut-off select transistor ST1 enters a write-inhibited state.

In the memory cell MT connected to the select transistor ST1 in the conducted state, electrons are injected into the charge storage film according to the voltage applied to the word line WL. While the memory cell MT connected to the word line WL to which a voltage Vpass is applied as the word line voltage enters the conducted state, regardless of the threshold voltage, electrons are not injected into the charge storage film. Meanwhile, in the memory cell MT connected to the word line WL to which the program voltage Vpgm is applied as the word line voltage, electrons are injected into the charge storage film according to the program voltage Vpgm.

That is, the row decoder 27 selects one of the word lines WL in the selected block BLK, applies the voltage Vpgm to the selected word line, and applies the voltage Vpass to the other non-selected word lines WL. The voltage Vpgm is a high voltage for injecting electrons into the charge storage film by using the tunnel phenomenon, and Vpgm>Vpass. By supplying data to each bit line BL with the sense amplifier 28 while controlling the voltage of the word line WL with the row decoder 27, the write operation is performed to each memory cell MT of the memory cell array 21.

Figure 8:
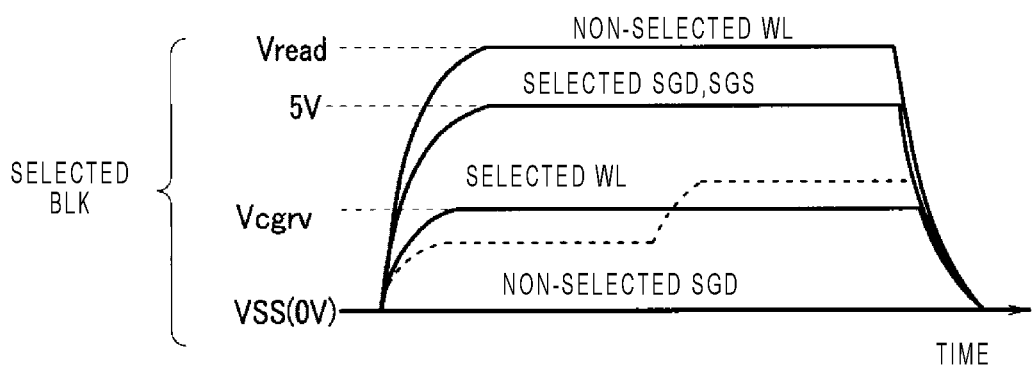
FIG. 8 is a diagram illustrating a voltage variation of each wire during a verify operation in the first embodiment.

FIG. 8 is a diagram illustrating a voltage variation of each wire during the verify operation. The row decoder 27 selects the block BLK and the string unit SU that have been subjected to the program operation, and applies, for example, 5 V to the select gate line SGS in the selected block BLK and the select gate line SGD in the selected string unit SU. As a result, both the select transistor ST1 and ST2 in the NAND string unit SU enter the ON state.

Meanwhile, the voltage Vss is applied to the select gate line SGS in the non-selected block BLK and the select gate line SGD in the non-selected string unit SU of the selected block BLK, such that the select transistors ST1 and/or ST2 enter into the OFF state. As a result, at least the select transistor ST1 in the NAND string of the non-selected string unit SU enters into the OFF state. Further, both the select transistors ST1 and ST2 in the NAND string of the non-selected block BLK enter the OFF state.

Further, the row decoder 27 selects one of the word lines WL in the selected block BLK, applies a voltage Vcgrv to the selected word line WL, and applies a voltage Vread to the other non-selected word lines WL. For example, when a program operation is performed to bring a threshold voltage of a memory cell MT into the level A, a voltage AV is used as the voltage Vcgrv for the verify operation. Similarly, when a program operation is to bring a threshold voltage of a memory cell MT into the level B, a voltage BV is used as the voltage Vcgrv for the verify operation. The voltage Vread is a voltage for turning ON the memory cells MT connected to the non-selected word lines WL, regardless of the threshold voltages thereof, and Vread>Vcgrv(GV). The GV is a verify voltage VrC that corresponds to the level C for the MLC write operation, and is a verify voltage Vr15 that corresponds to the state S15 for the QLC write operation.

Further, for example, during the verify operation for the data of the middle page in the first write operation, the voltage Vcgrv has the two voltage levels of the levels A and C as indicated by a dashed line in FIG. 8.

Then, the sense amplifier 28 charges each bit line BL with the voltage Vbl. The voltage Vbl is larger than a voltage Vsl of the source line SL, and thus, Vbl>Vsl. As a result, in the NAND string of the selected string unit SU, current flows (or does not flow) from the bit line BL toward the source line SL according to the threshold voltage of the memory cell MT connected to the selected word line WL. As a result, it may be verified that the threshold voltage has increased to a desired level.

As described above, the write operation is executed by repeating a loop including the program operation and the verify operation. During the program operation, the program voltage Vpgm is applied to the selected word line WL. During the subsequent verify operation, at least one of the verify voltages VrA to VrC corresponding to the levels A to C is applied for the MLC write operation, and at least one of the verify voltages Vr1 to Vr15 corresponding to the states S1 to S15 is applied for the QLC write operation, in accordance with the threshold voltage level to be verified. In each loop, the verify operation may be executed multiple times after the program operation is executed. Meanwhile, in each loop, the verify operation may not be executed after the program operation is executed. That is, the write operation includes multiple loops, and each loop includes at least the program operation. Further, each loop may include one or more verify operations. In each loop, the verify operation is executed subsequent to the program operation.

The program voltage Vpgm is set to the lowest voltage value in the first loop, and set to gradually increase as the second, third . . . loops progress. Further, the state for executing the verify operation is preset in each loop. As described below, a verify operation start loop is set for each target state. The verify operation of each state is performed only in a predetermined loop, and thereafter, a memory cell MT with a threshold voltage determined by the verify operation to have reached a set target area is brought into the write-inhibited state.

(Operation)

The writing of data is performed by a multi-step (two-step in the present embodiment) writing method that executes multiple steps. In the two-step writing method, data for half of n1 (n1=4 in the present embodiment) pages (two pages in the present embodiment) are written in a first writing, and data for the remaining half of the pages (two pages in the present embodiment) are written in a second writing.

Figures 9, 10:
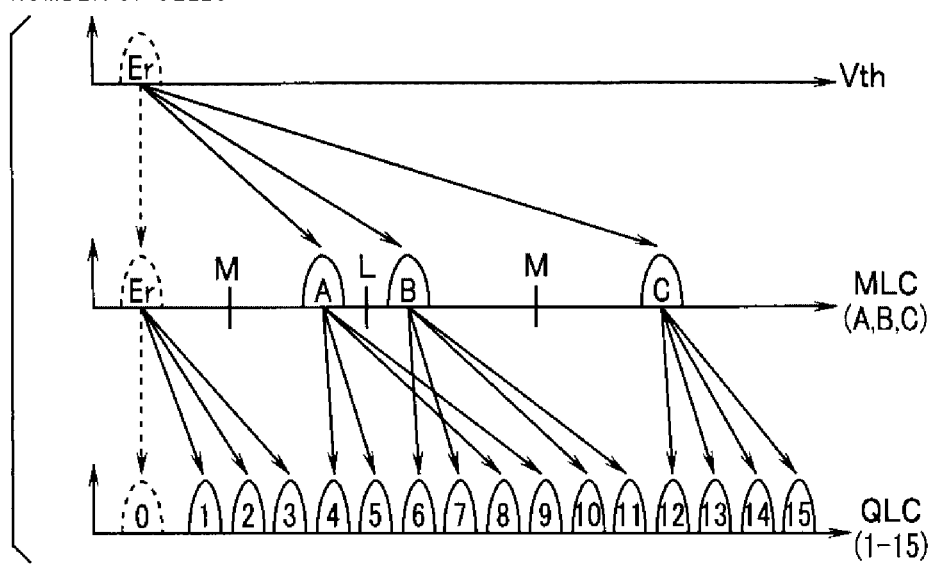
FIG. 9 is a diagram illustrating threshold voltage distributions in a two-step writing method according to the first embodiment.
FIG. 10 is a diagram illustrating an order of a write operation in the two-step writing method according to the first embodiment.

FIG. 9 is a diagram illustrating distributions of the threshold voltage Vth in the two-step writing method. In FIG. 9, the horizontal axis represents the threshold voltage Vth, and the vertical axis represents the number of memory cells.

As illustrated in FIG. 9, during the first write operation, a writing is performed to write 2-bit data in each memory cell MT as a multiple level cell (MLC). The first write operation is also referred to as an MLC write operation. In the first write operation (the MLC write operation), data that corresponds to any of 4-value data (the levels Er, A, B, and C) is written to each memory cell MT. During the second write operation, a writing is performed to store 4-bit data in each memory cell MT as a QLC. The second write operation is also referred to as a QLC write operation. In the second write operation (the QLC write operation), data that corresponds to any of 16-value data (the stats S0 to S15) is written to each memory cell MT.

In the MLC write operation, the data of the lower and middle (level) pages among the four pages are written. That is, in the first write operation, data corresponding to any of the four values (Er, A, B, and C) is written to each memory cell MT of the memory cell group MG corresponding to a certain select gate line SGD in the selected word line WL. In FIG. 9, "M" indicates the read voltage for the data of the middle page, and "L" indicates the read voltage for the data of the lower page. That is, the data of the lower and middle pages are written to be readable even before the QLC write operation is performed.

As illustrated in FIG. 9, each level of the four values written by the MLC write operation is further divided into four levels by the QLC write operation, so that 16-value data are written to each memory cell MT.

The sequencer 25 may write, for example, the data of the four pages at a time to each memory cell MT of the memory cell group MG. In this case, for example, the data of the lower, middle, upper, and top pages are stored in the latch circuits ADL, BDL, CDL, and DDL, respectively. The sequencer 25 writes the data of the four pages to each memory cell group MG by using the data stored in the four latch circuits ADL, BDL, CDL, and DDL.

In the two-step writing method, the sequencer 25 executes the QLC write operation after executing the MLC write operation. More specifically, the sequencer 25 executes the QLC write operation after a time elapses from the execution of the MLC write operation. In that case, during the QLC write operation, the sequencer 25 reads the data of the lower and middle pages from each memory cell MT which is a target of the QLC write operation. The sequencer 25 executes the QLC write operation by using the read data of the lower and middle pages and the data of the upper and top pages received from the memory controller 1. As a result, the amount of data transferred from the memory controller 1 to the nonvolatile memory 2 may be reduced.

FIG. 10 is a diagram illustrating an order of the write operation in the two-step writing method. FIG. 10 illustrates only the word lines WL0 to WL2 which is a part of the multiple word lines WL, and illustrates a case where five string units SU0 to SU4 are provided. The number in parentheses "[ ]" of FIG. 10 indicates an order of the write operation.

In the two-step writing method, a writing is alternately performed to two adjacent word lines WL. As illustrated in FIG. 10, the MLC write operation to the word line WL0 of the string units SU0 to SU4 is performed in an order ([1] to [5]), and then, the MLC write operation to the word line WL1 of the string unit SU0 is performed ([6]).

After the MLC write operation to the word line WL1 of the string unit SU0 is performed ([6]), the QLC write operation is performed to the word line WL0 of the string unit SU0 ([7]). After the QLC write operation to the word line WL0 of the string unit SU0 is performed, the MLC write operation is performed returning to the word line WL1 of the string unit SU1 ([8]).

Then, similarly, as illustrated in FIG. 10, the MLC write operation and the QLC write operation are alternately executed to the word lines WL0 and WL1 ([9] to [15]).

After the QLC write operation to the word line WL0 of the string unit SU4 is performed ([15]), the MLC write operation is performed to the word line WL2 of the string unit SU0 ([16]). After the MLC write operation to the word line WL2 of the string unit SU0 is performed ([16]), the QLC write operation is performed to the word line WL1 of the string unit SU0 ([17]).

Then, the MLC write operation and the QLC write operation are alternately executed to the word lines WL1 and WL2, similarly to the MLC write operation and the QLC write operation to the word lines WL0 and WL1 ([17]~).

As described above, after the QLC write operation is executed to all of the memory cells MT of the word lines WL(n−1) in all of the string units SU0 to SU4 ([15]), the MLC write operation is executed to one memory cell MT of the word line WL(n+1) of the string unit SU0 ([16]). Then, after the MLC write operation to the memory cell MT is executed, the QLC write operation is executed returning to the word line WLn of the string unit SU0 ([17]).

In the two-step writing method, the QLC write operation is executed after a time elapses from the execution of the MLC write operation. Here, the elapse of time causes a data retention deterioration (a variation of the threshold voltage of the memory cell MT caused due to a variation of electrons stored by the memory cell MT over time). For example, even when data of the state S15 is written to a certain memory cell MT by the QLC write operation, the threshold voltage distribution of the memory cell MT of the state S15 may be affected by the adjacent memory cell MT of the adjacent word line of which threshold voltage is a state of a relatively low threshold voltage such as the level Er, and thus, may shift in the decreasing direction of the threshold voltage.

Figure 11:
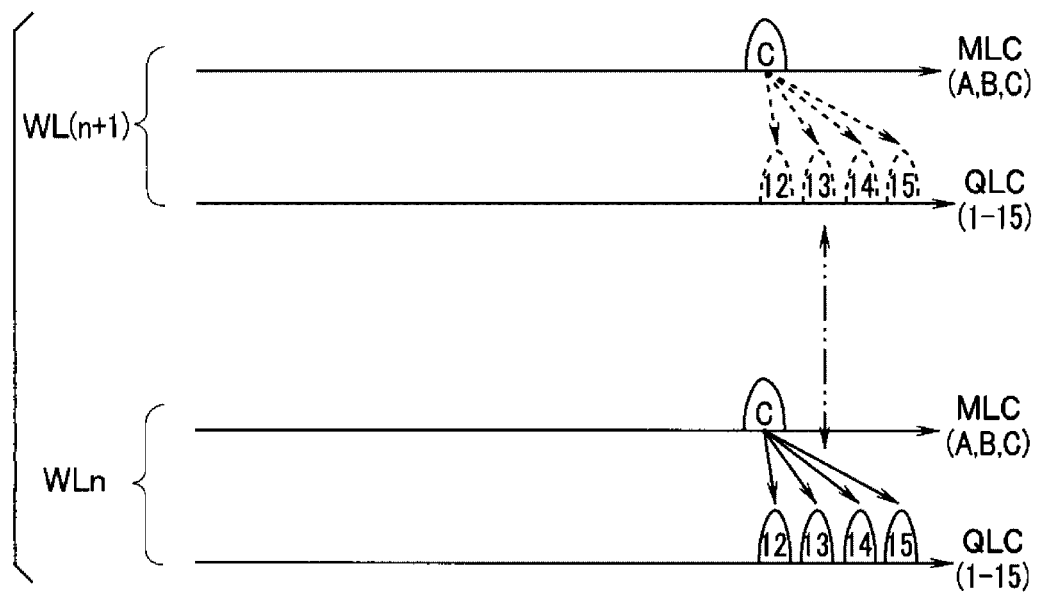
FIG. 11 is a diagram illustrating an example of threshold voltage distributions of two adjacent memory cells of two adjacent word lines in the first embodiment.
Figure 12:
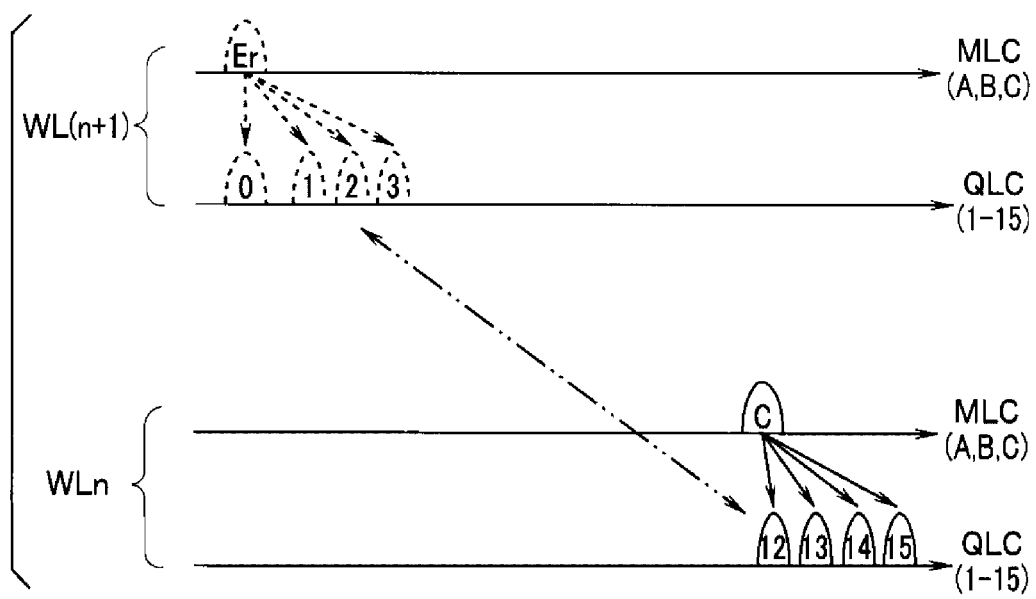
FIG. 12 is a diagram illustrating an example of threshold voltage distributions of two adjacent memory cells of two adjacent word lines in the first embodiment.

FIGS. 11 and 12 are diagrams illustrating an example of the threshold voltage distributions of two adjacent memory cells MT of two adjacent word lines WLn and WL(n+1). The lower portion of FIG. 11 illustrates threshold voltage distributions when the QLC write operation is executed to the memory cell MT of the word line WLn of the level C.

For example, when the threshold voltage distribution of a certain memory cell MTa of the selected word line WLn is the level C by the MLC write operation, the threshold voltage of the memory cell MT (hereinafter, also referred to as MTa) of the level C becomes any of the states S12 to S15 by the QLC write operation.

The upper portion of FIG. 11 illustrates threshold voltage distributions in a case where the QLC write operation is executed when the threshold voltage distribution of the adjacent memory cell MT of the memory cell MTa (i.e., the memory cell of the adjacent word line WL(n+1) (hereinafter, also referred to as MTb)) is the level C by the MLC write operation. The threshold voltage distribution of the memory cell MTb becomes any of the states S12 to S15 by the subsequent QLC write operation.

The upper portion of FIG. 12 illustrates threshold voltage distributions in a case where the QLC write operation is executed when the threshold voltage level of the memory cell MTb is the level Er by the MLC write operation. The threshold voltage level of the memory cell MTb becomes any of the states S0 to S3 by the subsequent QLC write operation.

In both the cases of FIGS. 11 and 12, the threshold voltage of the memory cell MTa after the QLC write operation is executed is affected by the charge of the adjacent memory cell MTb, and thus, the data retention deterioration occurs. However, in the case of FIG. 11, since the difference between the threshold voltage of the memory cell MTa and the threshold voltage of the adjacent memory cell MTb is small, the charge stored in the memory cell MTa is less likely to be leaked to the memory cell MTb. Meanwhile, in the case of FIG. 12, since the difference between the threshold voltage of the memory cell MTa and the threshold voltage of the adjacent memory cell MTb is large, the charge stored in the memory cell MTa may be more likely to be leaked toward the memory cell MTb. Especially, in the case of FIG. 12, since the memory cell MTa has the highest threshold voltage (the level C), and the adjacent memory cell MTb has the lowest threshold voltage (the level Er), the charge stored in the memory cell MTa may be more likely to be leaked toward the memory cell MTb. Thus, the threshold voltage distribution of the memory cell MTa of the level C may be more likely to change, that is, may be more likely to shift toward the relatively lower voltage after the QLC write operation is executed. The shift amount of the threshold voltage distribution of each memory cell MTa of the word line WLn varies according to the level (or state) of the threshold voltage of the adjacent memory cell MTb in the adjacent word line WL(n+1).

While FIGS. 11 and 12 illustrate the influence of the charge of the memory cell MTb of the adjacent word line WL(n+1) on the threshold voltage of the memory cell MTa of the selected word line WLn, the charge of the memory cell MTc of the adjacent word line WL(n−1) also affects the threshold voltage of the memory cell MTa.

Figure 13:
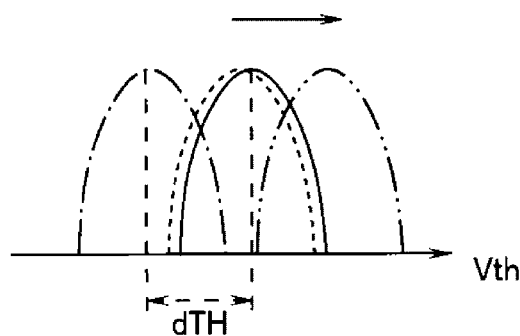
FIG. 13 is a diagram illustrating a variation of a threshold voltage distribution due to a data retention deterioration in the first embodiment.

FIG. 13 is a diagram illustrating the variation of the threshold voltage distribution due to the data retention deterioration. In FIG. 13, a solid line indicates the threshold voltage distribution immediately after the QLC write operation is executed, and a dashed line or an alternate long and short dashed line indicates the threshold voltage distribution shifted due to the data retention deterioration.

In the case of FIG. 11, since both the threshold voltages of the two adjacent memory cells MTa and MTb are high, the amount of charge leakage from the memory cell MTa to the adjacent memory cell MTb due to the data retention deterioration is relatively small. In that case, as indicated by the dashed line, the shift amount of the threshold voltage distribution of the memory cell MTa due to the data retention deterioration is relatively small.

However, in the case of FIG. 12, since the threshold voltage of the memory cell MTa is high, and the threshold voltage of the memory cell MTb is low, the amount of charge leakage from the memory cell MTa to the adjacent memory cell MTb due to the data retention deterioration is relatively large. Thus, as indicated by the alternate long and short dashed line in FIG. 13, the shift amount dTH of the threshold voltage distribution of the memory cell MTa due to the data retention deterioration is relatively large.

The shift amount dTH of the threshold voltage distribution of the memory cell MTa due to the data retention deterioration varies according to the charge amounts of the memory cells MTb and MTc adjacent to each memory cell MT of the selected word line WLn.

For example, when the threshold voltage distribution of the adjacent memory cell MTb is the level A, the shift amount of the threshold voltage distribution of the memory cell MTa due to the data retention deterioration is smaller than the shift amount dTH illustrated in FIG. 13. Further, when the threshold voltage distribution of the memory cell MTb is the level B, the shift amount of the threshold voltage distribution of the memory cell MTa due to the data retention deterioration is further smaller than the shift amount dTH illustrated in FIG. 13.

Further, as described above, the threshold voltage of the memory cell MTa is affected by not only the level (state) of the threshold voltage of the adjacent memory cell MTb of the adjacent word line WL(n+1), but also the level (or state) of the threshold voltage of the adjacent memory cell MTc of the adjacent word line WL(n−1).

To address such an issue, in the present embodiment, the verify voltage level in the QLC write operation for the memory cell MTa is adjusted based on the threshold voltages of both the two adjacent memory cells MTb and MTc.

Further, since the amount of charge leakage of the memory cell MTa varies according to the difference between the data of the memory cell MTa (target state) and the data of each of the adjacent memory cells MTb and MTc, it is preferable to adjust the verify voltage level in the QLC write operation according to the difference.

However, when the amount of charge leakage of the memory cell MTa is the largest when the difference between the threshold voltage of the memory cell MTa and the threshold voltage of each of the adjacent memory cells MTb and MTc is the largest, the verify voltage level in the QLC write operation may be adjusted only when the difference between read data of the memory cells MTb and MTc and write data of the memory cell MTa (target state) is the largest.

To implement this adjustment, in the present embodiment described hereinafter, the verify voltage level is adjusted only when the difference between the data of the adjacent memory cells MTb and MTc and the write data of the memory cell MTa (target state) is the largest. In other words, for example, the verify voltage level in the QLC write operation for the memory cell MTa is adjusted in the case of FIG. 13.

The adjustment of the verify voltage level is performed when the sequencer 25 executes the QLC write operation. The verify voltage level is set such that the threshold voltage distribution of the memory cell MTa becomes the high threshold voltage distribution indicated by an alternate one long and two short dashed line in FIG. 13.

Figure 14:
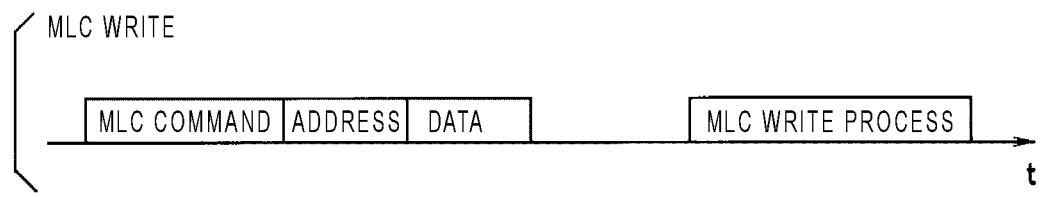
FIG. 14 is a diagram illustrating a command sequence for an MLC write operation (a first write operation) in the first embodiment.

Next, the sequence of the write operation of the sequencer 25 will be described. FIG. 14 is a diagram illustrating a command sequence in the MLC write operation. When the MLC write operation is executed, the memory controller 1 outputs an MLC write command, an address, and data to the nonvolatile memory 2. The MLC write command is a command for instructing the execution of the MLC write.

The sequencer 25 receives the MLC write command. Further, the sequencer 25 receives the address and the write data after receiving the MLC write command. After receiving the command, the address, and the data, the sequencer 25 executes the MLC write operation. The received data are stored in the two latch circuits ADL and BDL via the latch circuit XDL. The sequencer 25 executes the MLC write operation based on the data of the lower and middle pages stored in the latch circuits ADL and BDL.

Figure 15:
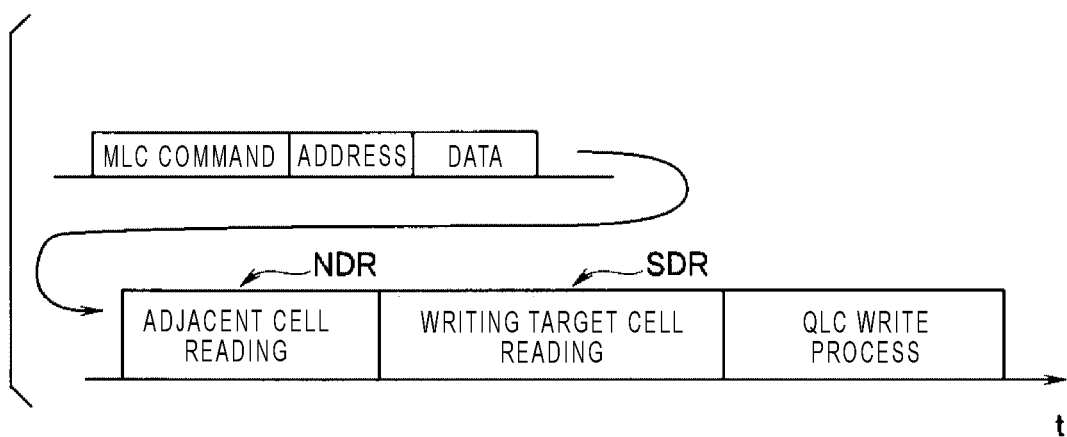
FIG. 15 is a diagram illustrating a command sequence for a QLC write operation (a second write operation) in the first embodiment.

FIG. 15 is a diagram illustrating a command sequence in the QLC write operation. When the QLC write operation is executed, the memory controller 1 outputs a QLC write command, an address, and data to the nonvolatile memory 2. The QLC write command is a command for instructing the execution of the QLC write.

First, the sequencer 25 receives the QLC write command. Further, the sequencer 25 receives the address and the data after receiving the QLC write command. After receiving the data, the sequencer 25 reads data from each memory cell MT of the memory cell group MG corresponding to the adjacent word line WL(n+1) and each memory cell MT of the memory cell group MG corresponding to the adjacent word line WL(n−1). The process of reading data from each memory cell MT of the memory cell group MG corresponding to the adjacent word line WL(n+1) and each memory cell MT of the memory cell group MG corresponding to the adjacent word line WL(n−1) is also referred to as an adjacent cell reading process NDR.

Hereinafter, the data written by the MLC write operation are also referred to as MLC written data. In the adjacent cell reading process NDR, the MLC written data of the adjacent word line WL(n−1) and the MLC written data of the adjacent word line WL(n+1) are read.

Subsequently, the sequencer 25 reads MLC written data from each memory cell MT of the memory cell group MG corresponding to the selected word line WLn. The process of reading the MLC written data from each memory cell MT of the memory cell group MG corresponding to the selected word line WLn is also referred to as a writing target cell reading process SDR. In the writing target cell reading process SDR, the data of the lower and middle pages written to the selected word line WLn by the MLC write operation are read.

In this way, when the QLC write command for the QLC write operation is received, the sequencer 25 executes the adjacent cell reading process NDR for reading the data of the multiple memory cells MT of the adjacent word lines WL(n+1) and WL(n−1), and the writing target cell reading process SDR for reading the MLC written data of each memory cell MT of the selected word line WLn.

Hereinafter, the process including the adjacent cell reading process NDR and the writing target cell reading process SDR will be referred to as an internal data reading process IDL1.

Then, the sequencer 25 executes the QLC write operation. For the QLC write operation, the program operation and the verify operation are executed. The program operation includes applying the program voltage and the verify voltage to the selected word line WL. The QLC write operation is executed based on the data of the lower and middle pages and the data of the upper and top pages. The data of the lower and middle pages are obtained by the writing target cell reading process SDR, and stored in the data latches ADL and BDL. The data of the upper and top pages are transmitted from the memory controller 1, and stored in the data latches CDL and DDL.

The sequencer 25 adjusts the verify voltage level in the QLC write operation, based on the difference between the data (i.e., the level of threshold voltage distribution) of the multiple memory cells MT of the adjacent word lines WL(n+1) and WL(n−1) (hereinafter, also referred to as adjacent memory cells) and the write data (i.e., the level of threshold voltage distribution) of the multiple memory cells MT of the word line WLn (hereinafter, also referred to as writing target memory cells).

The QLC write operation will be more specifically described.

Figure 16:
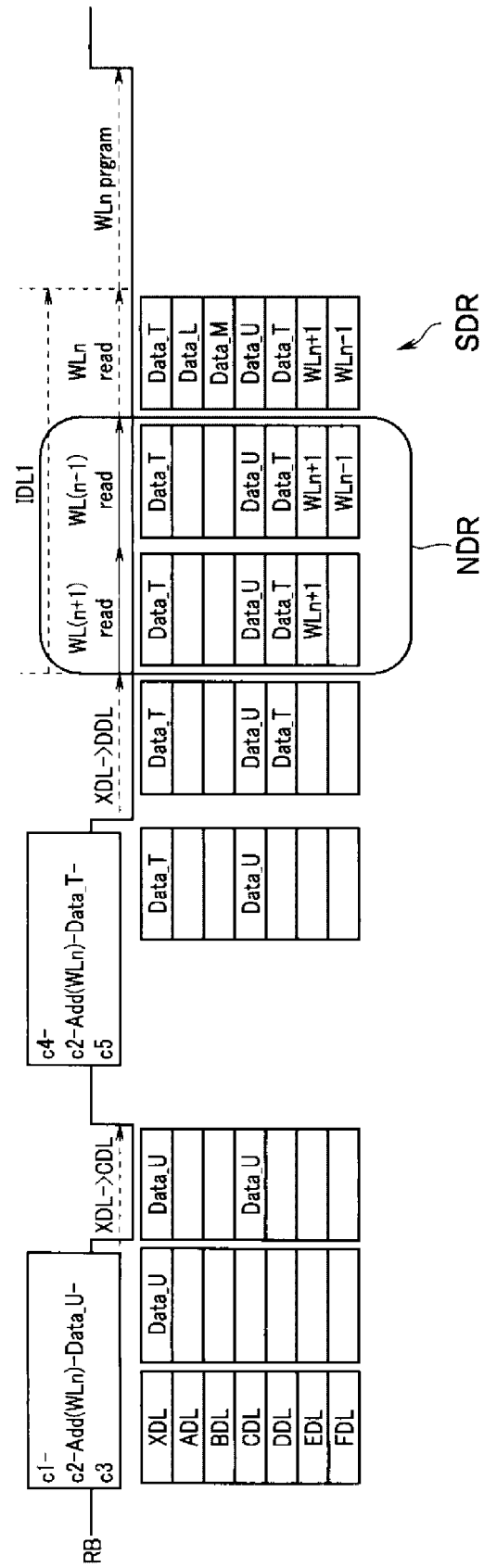
FIG. 16 is a diagram illustrating the command sequence of the QLC write operation (the second write operation), and data storage statuses of seven latch circuits as a result of execution of the command sequence in the first embodiment.

FIG. 16 is a diagram illustrating the command sequence of the QLC write operation, and data storing statuses of the seven latch circuits XDL to FDL as a result of the execution of the command sequence.

When the ready busy signal /RB is at the High level, the sequencer 25 receives a command c1 designating upper page data, a write command c2, address data (Add(WLn)), upper page data (Data_U), and a command c3. The commands and the address transmitted from the memory controller 1 are stored in the command register 24A and the address register 24B, respectively. The upper page data (Data_U) is transferred to and stored in the latch circuit XDL.

As illustrated in FIG. 16, the sequencer 25 sets the ready busy signal /RB to the Low level, and transfers the upper page data (Data_U) stored in the latch circuit XDL to the latch circuit CDL, based on the commands stored in the command register 24A. After the transfer, the ready busy signal /RB enters the High level.

Subsequently, when the ready busy signal /RB is at the High level, the sequencer 25 receives a command c4 designating top page data, a write command c2, address data (Add(WLn)), top page data (Data_T), and a command c5. The commands and the address transmitted from the memory controller 1 are stored in the command register 24A and the address register 24B, respectively. The top page data (Data_U) is transferred to and stored in the latch circuit XDL.

As illustrated in FIG. 16, the sequencer 25 sets the ready busy signal /RB to the Low level, and transfers the top page data (Data_T) stored in the latch circuit XDL to the latch circuit DDL, based on the commands stored in the command register 24A.

Subsequently, the sequencer 25 executes the internal data reading process IDL1.

In the adjacent cell reading process NDR, the MLC written data of the multiple memory cells MT of the two adjacent word lines WL(n+1) and WL(n−1) are read.

As illustrated in FIG. 16, a data reading (WL(n+1) read) is performed for the adjacent word line WL(n+1), and the sequencer 25 stores information on the written data (threshold voltage) of the adjacent memory cell MTb in the latch circuit EDL, based on the result of the data reading.

Figure 17:
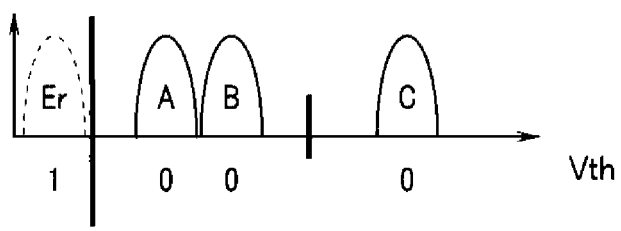
FIG. 17 is a diagram illustrating data stored in one latch circuit according to the first embodiment.

FIG. 17 is a diagram illustrating the data stored in the latch circuit EDL. As illustrated in FIG. 17, when the read data (threshold voltage) is the level A, B or C, the sequencer 25 stores "0" in the latch circuit EDL. Further, when the read data (threshold voltage) is the level Er, the sequencer 25 stores "1" in the latch circuit EDL.

Subsequently, the MLC written data of the multiple memory cells MT of the adjacent word line WL(n−1) are read.

Subsequently, as illustrated in FIG. 16, a data reading (WL(n−1) read) is performed for the adjacent word line WL(n−1), and the sequencer 25 stores information on the written data (threshold voltage) of the adjacent memory cell MTb in the latch circuit FDL, based on the result of the data reading.

The writing target cell reading process SDR is executed subsequent to the adjacent cell reading process NDR. In the writing target cell reading process SDR, the MLC written data of the multiple memory cells MT of the word line WLn are read. The sequencer 25 stores the result of the data reading in the latch circuits ADL and BDL. The lower page data is stored in the latch circuit ADL, and the middle page data is stored in the latch circuit BDL.

While adjusting the verify voltage level based on the data stored in the latch circuits ADL to FDL, the sequencer 25 executes the write operation to the word line WLn (a memory cell group MG selected by a combination of the word line WLn and the select gate line SGD).

As described above, in the present embodiment, the adjustment of the verify voltage level is performed for the memory cell MT to which data of the level C is written by the MLC write operation, in the selected word line WLn. Accordingly, the adjustment of the verify voltage level is performed during the verify operation after the program operation is performed to the memory cell MT of which target state is S12 to S15.

Figure 18:
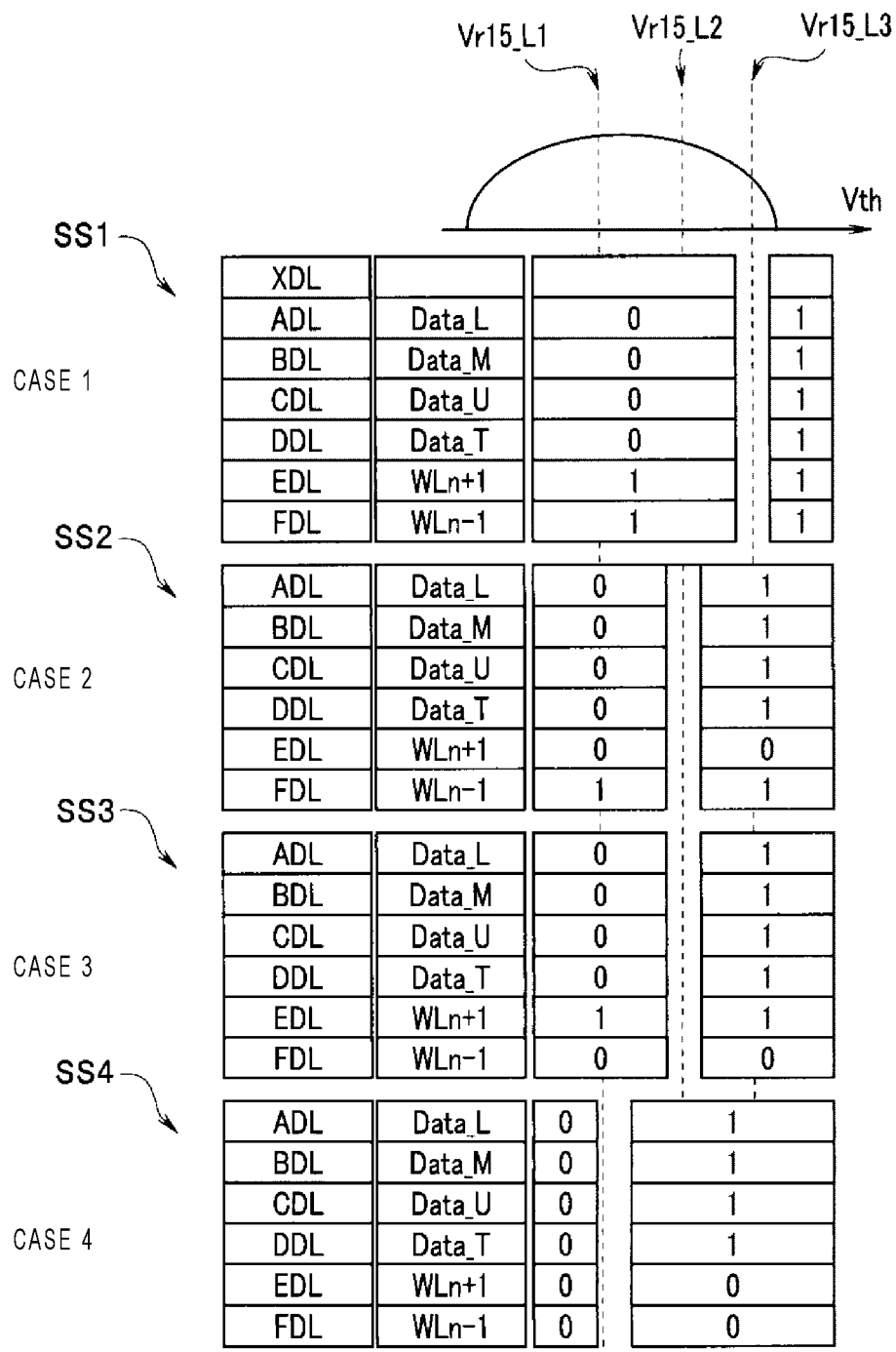
FIG. 18 is a diagram illustrating a relationship between threshold voltage distributions and data of six latch circuits during the verify operation in the first embodiment.
Figures 19, 20:
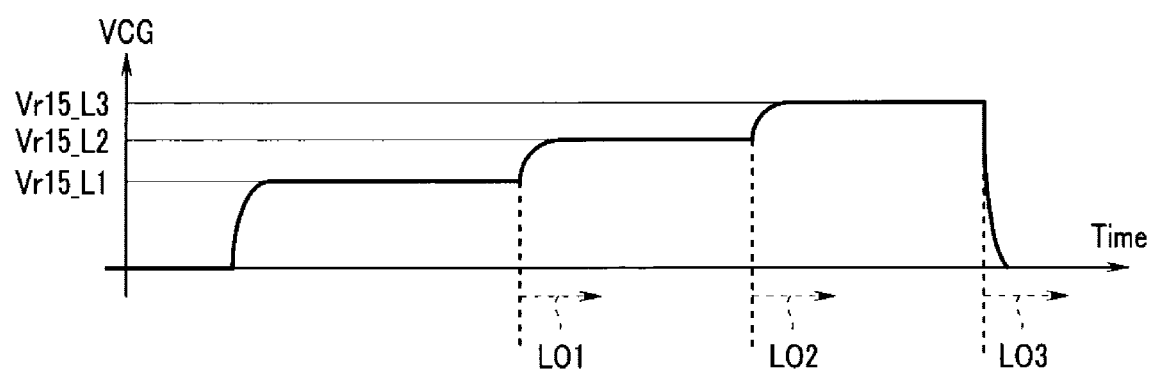
FIG. 19 is a diagram illustrating a variation of a verify voltage level during a verify operation of a state S15 in the first embodiment.
FIG. 20 is a diagram illustrating an example of data when one latch circuit is used, in the first embodiment.

FIG. 18 is a diagram illustrating a relationship between the threshold voltage distribution and the data of the latch circuits ADL to FDL in the verify operation. In the distribution of FIG. 18, the horizontal axis represents the threshold voltage, and the vertical axis represents the number of memory cells MT that correspond to a corresponding threshold voltage in the memory cell group MG. FIG. 19 is a diagram illustrating the variation of the verify voltage level during the verify operation of the state S15. In FIG. 19, the horizontal axis represents time, and the vertical axis represents the verify voltage level (or the read voltage VCG).

In FIG. 18, SS1 represents the variation of the data of the latch circuits ADL to FDL when all of the MLC written data of the two adjacent memory cells MTb and MTc of the adjacent word lines WL(n+1) and WL(n−1) are the level Er (Case 1). The number "1" is stored in both the latch circuits EDL and FDL. The number "0" is stored in the latch circuits ADL to DDL as data corresponding to the state S15.

In FIG. 18, SS2 represents the variation of the data of the latch circuits ADL to FDL when the MLC written data of the adjacent memory cell MTb of the adjacent word line WL(n+1) is any of the levels A, B, and C, and the MLC written data of the adjacent memory cell MTc of the adjacent word line WL(n−1) is the level Er (Case 2). The number "0" is stored in the latch circuit EDL, and the number "1" is stored in the latch circuit FDL. The number "0" is stored in the latch circuits ADL to DDL as data corresponding to the state S15.

In FIG. 18, SS3 represents the variation of the data of the latch circuits ADL to FDL when the MLC written data of the adjacent memory cell MTb of the adjacent word line WL(n+1) is the level Er, and the MLC written data of the adjacent memory cell MTc of the adjacent word line WL(n−1) is any of the levels A, B, and C (Case 3). The number "1" is stored in the latch circuit EDL, and the number "0" is stored in the latch circuit FDL. The number "0" is stored in each of the latch circuits ADL to DDL as data corresponding to the state S15.

In FIG. 18, SS4 represents the variation of the data of the latch circuits ADL to FDL when the MLC written data of the two adjacent memory cells MTb and MTc of the adjacent word lines WL(n+1) and WL(n−1) are any of the levels A, B, and C (Case 4). The number "0" is stored in both the latch circuits EDL and FDL. The numeral "0" is stored in each of the latch circuits ADL to DDL as data corresponding to the state S15.

In Case 1, the amount of charge leakage to the adjacent memory cell MT is the largest. In Case 4, the amount of charge leakage to the adjacent memory cell MT is the smallest. In Cases 2 and 3, the amount of charge leakage to the adjacent memory cell MT is less than that of Case 1 and greater than that of Case 4.

Thus, the write operation of data is executed by setting the verify voltage level of each memory cell MTa to any of the three stages.

The sequencer 25 executes the verify operation for each memory cell MTa of the selected word line WLn, based on the MLC written data of the two adjacent memory cells MTb and MTc of the adjacent word lines WL(n+1) and WL(n−1), the MLC written data of the memory cell MTa of the writing target, and the target state data.

In each memory cell MTa, the adjustment of the verify voltage level is not performed unless the target state is any of S12 to S15.

Further, even though the target state is any of S12 to S15, the adjustment of the verify voltage level is not also performed for each memory cell MTa when the MLC written data of both the two memory cells MTb and MTc are not the Er state (when the MLC written data are any of the levels A, B, and C). That is, in Case 4, the adjustment of the verify voltage level is not performed.

However, the adjustment of the verify voltage level is performed for each memory cell MTa when the target state is any of S12 to S15, and the MLC written data of one of the two memory cells MTb and MTc is the Er state. That is, in Cases 2 and 3, the adjustment of the verify voltage level is performed.

Further, the adjustment of the verify voltage level is also performed for each memory cell MTa when the target state is any of S12 to S15, and the MLC written data of both the two memory cells MTb and MTc are the Er state. That is, the adjustment of the verify voltage level is also performed in Case 1.

The sequencer 25 sets multiple verify voltage levels for the verify operation of each of the states S12 to S15. The verify voltage levels are set for each memory cell MT.

As illustrated in FIG. 19, multiple verify voltage levels corresponding to Cases 1 to 4 are set. FIG. 19 illustrates an example where multiple levels of verify voltages Vr15_L1, Vr15_L2, and Vr15_L3 are used, instead of one standard verify voltage Vr15, for the verify operation of the state S15. For example, the verify voltage Vr15_L2 is higher than the verify voltage Vr15_L1 by a predetermined offset amount, and the verify voltage Vr15_L3 is higher than the verify voltage Vr15_L2 by a predetermined offset amount. That is, during the verify operation of a certain state included in the QLC write operation, the sequencer 25 applies the multiple levels of verify voltages step by step, instead of one standard verify voltage. Which of the multiple levels of verify voltages is to be applied is selected according to the data written to the two adjacent memory cells MTb and MTc.

The verify voltage Vr15_L1 is applied to the memory cell MT of Case 4. The verify voltage Vr15_L2 is applied to the memory cells MT of Cases 2 and 3. The verify voltage Vr15_L3 is applied to the memory cell MT of Case 1.

While FIGS. 18 and 19 illustrate an example where the multiple levels of verify voltages are used for the verify operation of the state S15, the multiple levels of verify voltages may also be used for the verify operation of each of the states S12, S13, and S14. The verify voltages of the three stages are also used for the verify operation of each of the states S12, S13, and S14, as in the verify operation of the state S15. Further, the offset amount of the verify voltage may differ for each state.

In such a manner, during the verify operation of the state S15 of the selected word line WLn, the verify voltage Vr15 L1 is applied to the memory cell MT of Case 4, the verify voltage Vr15 L2 is applied to the memory cells MT of Cases 2 and 3, and the verify voltage Vr15 L3 is applied to the memory cell MT of Case 1.

As described above, the sequencer 25 reads the data written to the two memory cells MTb and MTc adjacent to the memory cell MTa, and sets the multiple verify voltage levels for the verify operation of the memory cell MTa in the QLC write operation, based on the read data and the data written to the memory cell MTa by the MLC write operation.

Further, the sequencer 25 changes the multiple verify voltage levels for a case where both the two memory cells MTb and MTc are the level Er, and a case where one of the two memory cells MTb and MTc is the level Er. That is, the sequencer 25 sets the multiple verify voltage levels according to the data written to the two memory cells MTb and MTc.

Further, when the verify operation passes at the level corresponding to any of the verify voltages Vr15_L1, Vr15_L2, and Vr15_L3, all of the data of the latch circuits ADL to DDL corresponding to the memory cell MT are rewritten from the data "0" to the data "1" (data indicating the state S0). That is, all of the data of the latch circuits ADL to DDL are maintained as the data "0" until it is determined that the memory cell MT has reached the threshold voltage distribution of the state S15. However, when the verify operation passes at the level corresponding to any of the verify voltages Vr15_L1, Vr15_L2, and Vr15_L3, all of the data of the latch circuits ADL to DDL corresponding to the memory cell MT are updated from the data "0" (data indicating the state S15) to the data "1" (data indicating the state S0), so that the corresponding memory cell MT is excluded from targets of the program operation in the next and subsequent loops (set to enter the write-inhibited state). Further, the data of the latch circuits EDL and FDL are not changed.

Specifically, in FIG. 19, when the verify operation passes at the verify voltage Vr15_L1 for the memory cell MT corresponding to Case 4, a data latch operation LO1 of the latch circuits ADL to DDL is executed, and all of the data of the latch circuits ADL to DDL are updated to "1". When the verify operation passes at the verify voltage Vr15_L2 for the memory cells MT corresponding to Case 2 or 3, a data latch operation LO2 of the latch circuits ADL to DDL is executed, and all of the data of the latch circuits ADL to DDL are updated to "1". Further, when the verify operation passes at the verify voltage Vr15 L3 for the memory cell MT corresponding to Case 1, a data latch operation LO3 of the latch circuits ADL to DDL is executed, and all of the data "0" of the latch circuits ADL to DDL are updated to "1".

Further, in the example described above, the latch circuits EDL and FDL corresponding to the adjacent word lines WL(n+1) and WL(n−1) are used. Alternatively, only one latch circuit EDL may be used. That is, at least one latch circuit may be used for storing the data of the two adjacent memory cells of the adjacent word lines WL(n+1) and WL(n−1).

FIG. 20 is a diagram illustrating an example of data when one latch circuit EDL is used. FIG. 20 illustrates data when information on the data of the two adjacent memory cells MTb and MTc is stored in one latch circuit EDL.

As illustrated in FIG. 20, when all of the data of the two adjacent memory cells MTb and MTc of the two word lines WL(n+1) and WL(n−1) are Er, the sequencer 25 stores "1" in the latch circuit EDL. When the data of one of the two adjacent memory cells MTb and MTc is Er, the sequencer 25 stores "0" in the latch circuit EDL. When all of the data of the two adjacent memory cells MTb and MTc are any of A, B, and C, the sequencer 25 stores "0" in the latch circuit EDL. That is, FIG. 20 is a table illustrating the correspondence between the read results for the two adjacent memory cells MTb and MTc and the data to be stored in the latch circuit EDL.

Figure 21:
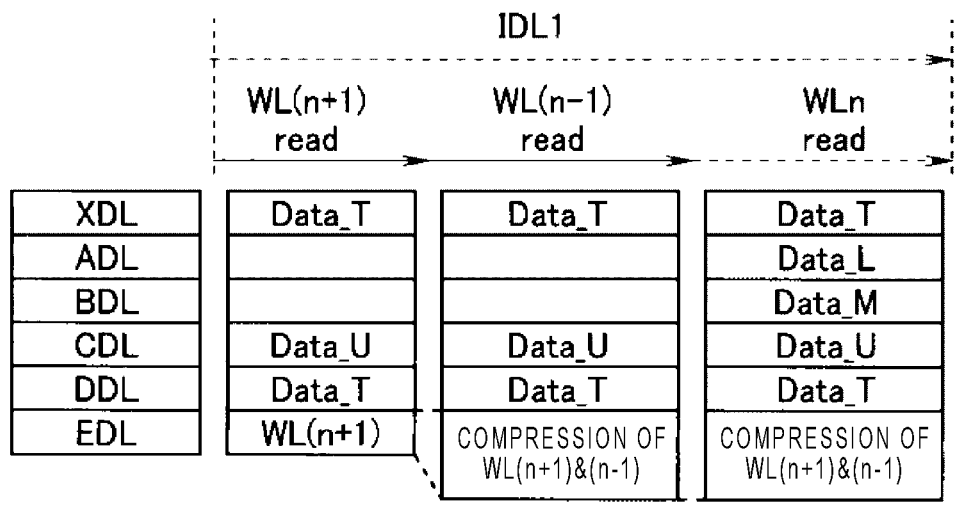
FIG. 21 is a diagram illustrating a variation of data of five latch circuits ADL to EDL during an internal data reading process when one latch circuit is used, in the first embodiment.

FIG. 21 is a diagram illustrating the variation of the data of the latch circuits ADL to EDL during the internal data reading process IDL1 when one latch circuit EDL is used. As illustrated in FIG. 21, the MLC written data of the multiple memory cells MTb of the adjacent word line WL(n+1) are read (WL(n+1) read), and the results of the data reading are stored in the latch circuit EDL.

Subsequently, the MLC written data of the multiple memory cells MTc of the adjacent word line WL(n−1) are read, and the sequencer 25 stores the data based on the reading results of the two adjacent memory cells MTb and MTc in the latch circuit EDL, according to the table illustrated in FIG. 20. Then, the sequencer 25 reads the MLC written data of the multiple memory cells MTa of the selected word line WLn (WLn read), and stores the results of the data reading in the latch circuits ADL and BDL. Then, the sequencer 25 executes the write operation to the word line WLn, while adjusting the verify voltage level based on the data stored in the latch circuits ADL to EDL.

Accordingly, the same effect as that in the embodiment described above may be obtained even when one latch circuit EDL is used.

As described above, the verify voltage level of the memory cell MTa (the memory cell of Case 1) assumed to have the largest amount of charge leakage to the adjacent memory cells MTb and MTc is set to be high. Further, the verify voltage level of the memory cells MTa (the memory cells of Cases 2 and 3) assumed to have the slightly large amount of charge leakage to the adjacent memory cells MTb and MTc is also set to be slightly high.

As a result, the memory cell MTa adjacent to the memory cells MTb and MTc of the level Er has the relatively high threshold voltage distribution, immediately after the QLC write operation is executed. For that reason, even when the threshold voltage distribution of the memory cell MTa shifts toward a relatively low threshold voltage, the threshold voltage distributions of the multiple memory cells MT of the same state in the same word line WL become substantially uniform.

Since the threshold voltage distribution of each memory cell MTa of the selected word line WLn is affected by the states of the threshold voltage distributions of the corresponding adjacent memory cells MTb and MTc in the adjacent word lines WL(n+1) and WL(n−1), the threshold voltage distribution of each memory cell MTa of the selected word line WLn may vary largely. For example, when an additional read voltage level correcting process such as reading the adjacent word lines is performed in order to read data in a state where the threshold voltage distribution varies, it takes a relatively longer time to read the data.

Meanwhile, according to the present embodiment, since the occurrence rate of the correcting process is reduced, the time required for reading data may be reduced.

Next, modifications of the embodiment described above will be described.

Modification 1

In the embodiment described above, each sense amplifier unit SAU stores the data indicating whether the data of the adjacent memory cells MTb and MTc are the level Er, in the latch circuits EDL and FDL. However, as described above, the amount of charge leakage varies according to the difference in data between the memory cell MTa and each of the adjacent memory cells MTb and MTc. To address this issue, each sense amplifier unit SAU may be configured to have relatively more latch circuits capable of storing the information indicating the data (levels Er, A, B, and C) of the adjacent memory cells MTb and MTc, such that the multiple verify voltage levels may be more finely set according to the difference between the MLC written data (or target state) of the memory cell MTa and the data of the adjacent memory cells MTb and MTc.

For example, the verify voltage levels may be set to be different for a case where the adjacent memory cell MTb is at the level Er and a case where the adjacent memory cell MTb is at the level A.

That is, the levels of the data of the adjacent memory cells MTb and MTc among the four levels Er, A, B, and C are stored, and the sequencer 25 more finely sets the verify voltage level according to the difference between the stored data and the MLC written data (or target state) of the memory cell MTa.

According to this configuration, the verify voltage level may be more finely adjusted step by step, so that the time required for reading data may be less likely to be affected by the data retention deterioration.

Modification 2

The verify voltage level in the QLC write operation for the memory cell MTa may be adjusted based on only one of the two adjacent memory cells MTb and MTc.

In the modification described above, when the QLC write operation is executed for the memory cell MTa of the selected word line WLn, the verify voltage level in the QLC write operation of the word line WLn is adjusted according to the difference between the two MLC written data of the two memory cells MTb and MTc and the MLC written data (or target state) of the memory cell MTa. Alternatively, the verify voltage level in the QLC write operation for the word line WLn may be adjusted according to the difference between the MLC written data of at least one of the two memory cells MTb and MTc of the adjacent word lines WL(n+1) and WL(n−1) and the MLC written data (or target state) of the memory cell MTa. For example, the verify voltage level in the QLC write operation for the word line WLn may be adjusted according to the difference between the MLC written data of the memory cell MTb of the adjacent word line WL(n+1) and the MLC written data (or target state) of the memory cell MTa.

The same effect as that in the first embodiment may also be obtained from Modification 2.

Second Embodiment

In the first embodiment, during the second write operation (the QLC write operation), the charge leakage caused by the data retention deterioration is assumed, and the verify voltage level is adjusted in advance to obtain a relatively high threshold voltage distribution when the assumed leakage amount is large.

However, when the second write operation (the QLC write operation) is performed immediately after the first write operation (the MLC write operation), the data retention deterioration is less likely to occur. Meanwhile, when the second write operation is performed after a certain amount of time elapses from the first write operation, the data retention deterioration is more likely to occur.

To more precisely address such an issue, in the second embodiment, by reading the MLC written data (the data written by the first write operation) during the second write operation, the shift amount of the threshold voltage distribution is detected, that is, the degree of data retention deterioration is determined. Then, the verify operation start loop of each state is adjusted according to the shift amount (difference).

Similarly to the first embodiment, the present embodiment also relates to a case where each memory cell group MG is capable of storing 4-bit data, and the same two-step writing method as that in FIG. 9 is used as the multi-step writing method.

Since the configuration of the memory system according to the present embodiment is the same as the configuration of the memory system according to the first embodiment, descriptions of the same components in the memory system of the present embodiment as those in the memory system of the first embodiment will be omitted, and different components will be described in detail.

Figure 22:
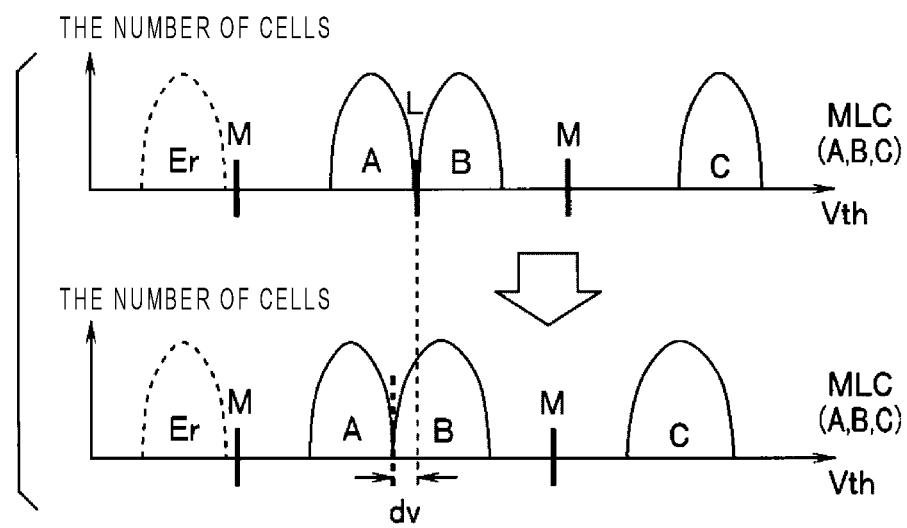
FIG. 22 is a diagram illustrating variations of threshold voltage distributions of four levels due to a data retention deterioration after an MLC write operation (a first write operation) is ended, in a second embodiment.

First, the variation of the threshold voltage distribution due to the data retention deterioration will be described. FIG. 22 is a diagram illustrating variations of the threshold voltage distributions of the four levels due to the data retention deterioration after the MLC write operation is executed.

The upper portion of FIG. 22 illustrates the threshold voltage distributions of the four levels Er, A, B, and C immediately after the MLC write operation is executed. The "M" indicates the read voltage of the middle page data, and the "L" indicates the read voltage of the lower page data. After the MLC write operation is executed, the lower page data may be read using the read voltage L, and the middle page data may be read using the read voltage M. The read voltages M and L are, for example, set information stored by the sequencer 25, and are preset. Hereinafter, the reading of the data of the lower and middle pages will also be referred to as an MLC read.

The lower portion of FIG. 22 illustrates the threshold voltage distributions of the four levels Er, A, B, and C after a time elapses from the MLC write operation. Due to the data retention deterioration, the threshold voltage distributions of the three levels A, B, and C change, and the read voltages M and L to be applied to the selected word line decrease. The lower portion of FIG. 22 illustrates that the read voltage L of the level B decreases by a shift amount dv.

The shift amount dv is detected by a Vth tracking read to be described below. Similarly, the shift amounts of the threshold voltage distributions of the levels A and C are also calculated by the Vth tracking read.

When the threshold voltage distributions of the levels A, B, and C change due to the data retention deterioration, read data obtained by reading the MLC data using the preset read voltages M and L for the QLC write operation may be read as different data. In this case, a reading error occurs. As a result, the reliability of the MCL read during the QLC write operation is degraded.

Further, in general, when it is assumed that a threshold voltage has not reached the vicinity of a target state during the QLC write operation, the verify operation is omitted. By omitting the verify operation, a writing time TPROG is reduced. Thus, the verify operation start loop is preset in association with the multiple loops included in the write operation.

However, when the threshold voltage distribution shifts toward a relatively lower voltage due to the data retention deterioration after the MLC write operation is executed, the threshold voltage distribution of each memory cell MT does not reach the vicinity of the target state at the time when the verify operation for the target state is started. For that reason, the verify operation is unnecessary, and thus, the writing time TPROG unnecessarily increases.

Thus, in the present embodiment, first, the Vth tracking read is performed in the MLC read for the QLC write operation. The Vth tracking read is performed to search for an optimum value of the read voltage of the MLC read, and to perform the MLC read by using the corrected read voltage obtained by the search. Since the QLC write operation is executed using the MLC data read by the MLC read, a reading error is less likely to occur during the MLC read.

Figure 23:
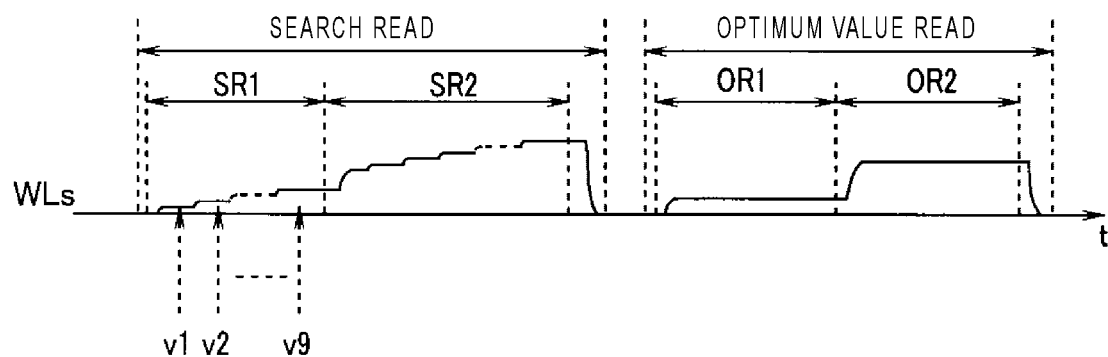
FIG. 23 is a diagram illustrating a variation of a read voltage of a selected word line during a Vth tracking read, in the second embodiment.
Figure 24:
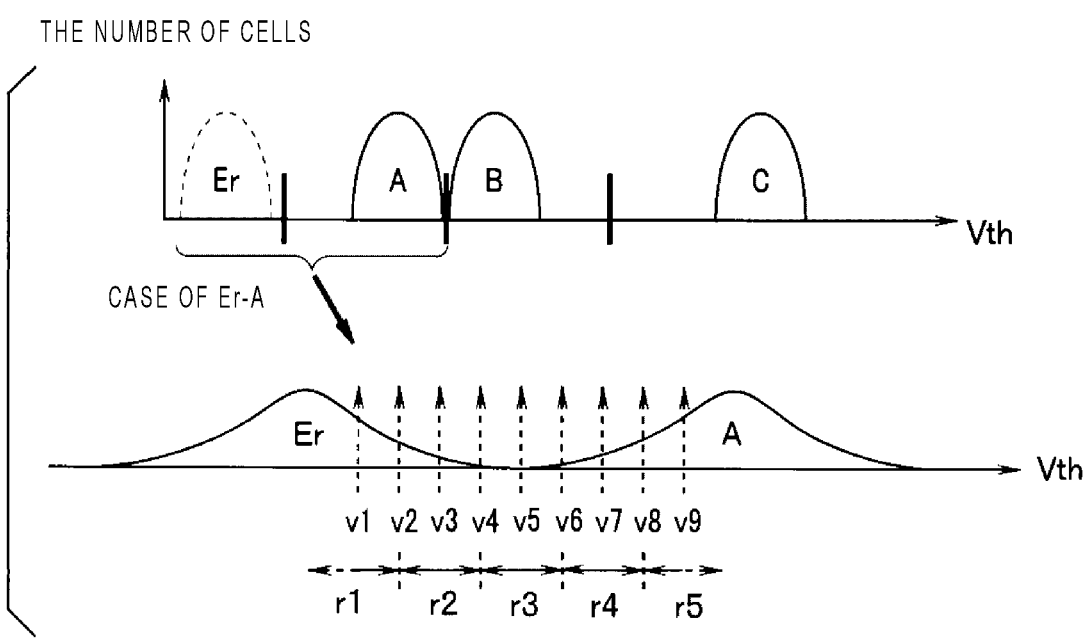
FIG. 24 is a diagram illustrating a valley position searching process during the Vth tracking read in the second embodiment.

FIG. 23 is a diagram illustrating a variation of the read voltage of the selected word line WLn during the Vth tracking read. FIG. 24 is a diagram illustrating a valley position searching process during the Vth tracking read.

As illustrated in FIG. 23, the MLC read during the QLC write operation includes two read operations of a search read and an optimum value read. Hereinafter, the MLC read during the QLC write operation may also be referred to as an internal data reading process IDL2. FIG. 23 illustrates a case of a data reading using an optimum value of each of read voltages AR and CR when the data of the middle page is read.

The search read is a read operation to search for an optimum read voltage according to the Vth tracking read. As illustrated in FIG. 23, the search read includes a search read SR1 for the read voltage AR and a search read SR2 for the read voltage CR. Further, the optimum value read includes an optimum value read OR1 using the read voltage AR and an optimum value read OR2 using the read voltage CR. FIG. 24 is a diagram illustrating the Vth tracking read that searches for an optimum value of the read voltage between the two threshold voltage distributions of the levels Er and A. Descriptions of the Vth tracking read that searches for optimum values of the read voltages between the levels A and B and between the levels B and C will be omitted.

As illustrated in FIG. 24, in the Vth tracking read, a reading is performed multiple times in order to calculate an optimum read voltage (i.e., a valley position) existing between the levels Er and A. The reading is performed multiple times by changing the read voltage within a predetermined range. The predetermined range of the Vth tracking read and the number of times of performing the reading are preset based on an assumed shift amount between the levels due to an assumed data retention deterioration.

The valley position is determined from, for example, a ratio of the number of memory cells MT that are turned ON and the number of memory cells MT that are turned OFF, during each of the multiple readings.

FIG. 24 illustrates the Vth tracking read that searches for the valley position of the levels Er and A, in order to search for an optimum read voltage of the middle page as an example. In implementation, the Vth tracking read is performed for three optimum read voltages of the lower and middle pages.

FIG. 24 illustrates a case where a reading is performed nine times within the predetermined range based on nine different read voltages v1 to v9. In the search read, an optimum read voltage is calculated based on the read data, so that the valley position is determined. Each valley position is determined for each word line WL.

As described below, the position of the verify operation start loop is adjusted based on which of multiple ranges r1, r2, r3, r4, and r5 determined by the read voltages v1 to v9 is a range in which the valley position determined by the Vth tracking read falls. That is, the timing of starting the verify operation is adjusted.

Since the MLC read is executed by using the calculated optimum read voltage of each page, the reading error may be less likely to occur during the MLC read.

Further, a predetermined verify operation start loop is set for each target state.

Figure 25:
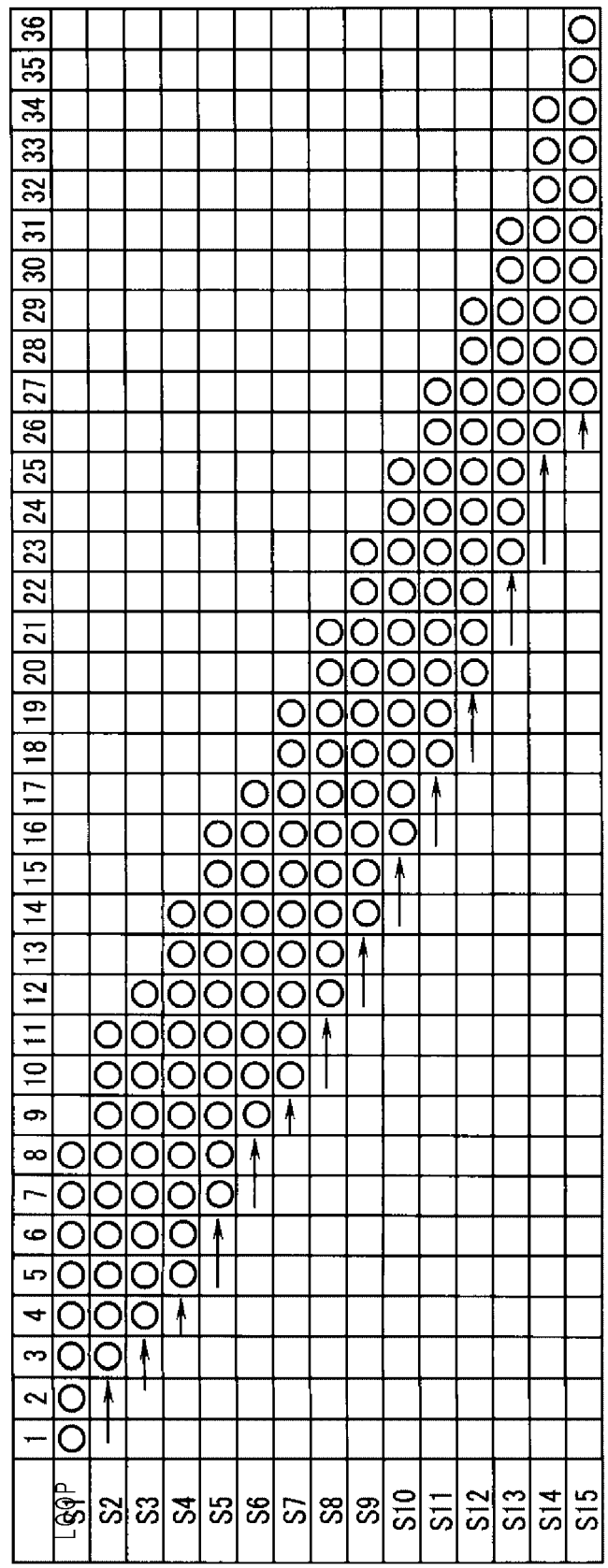
FIG. 25 is a diagram illustrating a relationship between a loop for a write operation and a verify operation in the second embodiment.

FIG. 25 is a diagram illustrating a relationship between the loop and the verify operation during the write operation. FIG. 25 illustrates the range of loops 1 to 36. The relationship between the state for which the verify operation is performed and the loop as illustrated in FIG. 25 is preset, and the verify operation is performed based on the preset relationship.

The write operation of data includes the program operation and the verify operation. FIG. 25 illustrates loop in which the verify operation is performed, in association with each state. In each of states S1 to S15, the program operation is executed from a first loop. The program operation is performed to the last loop including a circle, in each of the states S1 to S15.

Each arrow in FIG. 25 indicates the verify operation start loop for each target state. Each circle in FIG. 25 indicates a loop in which the verify operation can be performed. For example, the verify operation for the data of the state S5 is performed from the loop 7 to the loop 16. The loop 7 is the verify operation start loop of S5, and the loop 16 is a verify operation end loop of S5. In other words, for the data of the state S5, it is assumed that the threshold voltage has not reached the vicinity of the target state (S5) by the program operations from the loop 1 to the loop 6, and thus, the verify operations to the loop 6 are omitted. By omitting the unnecessary verify operations, the writing time TPROG may be reduced.

In the present embodiment, the verify operation start loop of each state is adjusted according to which of the multiple ranges r1, r2, r3, r4, and r5 is a range in which the valley position determined by the Vth tracking read described above falls.

In the present embodiment, for example, the sequencer 25 stores the offset amount dL according to the valley position determined by the Vth tracking read, and resets the verify operation start loop in accordance with the offset amount dL based on the preset table. Further, the offset amount for the verify operation start loop is changed according to the shift amount dv of the valley position. Here, the offset amount is changed such that the offset amount when the valley position falls in the range of r1 (i.e., the number of added loops) is 2dL, the offset amount when the valley position falls in the range of r2 is dL, the offset amount when the valley position falls in the range of r3 is 0, the offset amount when the valley position falls in the range r4 is (−dL), and the offset amount when the valley position falls in the range r5 is (−2dL). Accordingly, for example, when the verify operation start loop of a certain state is set to 10 in a case where the offset amount dL is "1", and the valley position falls in the range r1, the verify operation start loop of the state is changed to 12 which is two loops late. Further, when the verify operation start loop of a certain state is set to 10 in a case where the valley position falls in the range r4, the verify operation start loop of the state is changed to 9 which is one loop early.

That is, the sequencer 25 searches for the valley position between threshold voltage distributions corresponding to data written by the MLC write operation, and changes the verify operation start loop for the verify operation based on the voltage of the searched valley position. Here, the sequencer 25 changes the verify operation start loop according to the difference between the voltage of the valley position and the read voltage preset for reading the MLC data.

Figure 26:
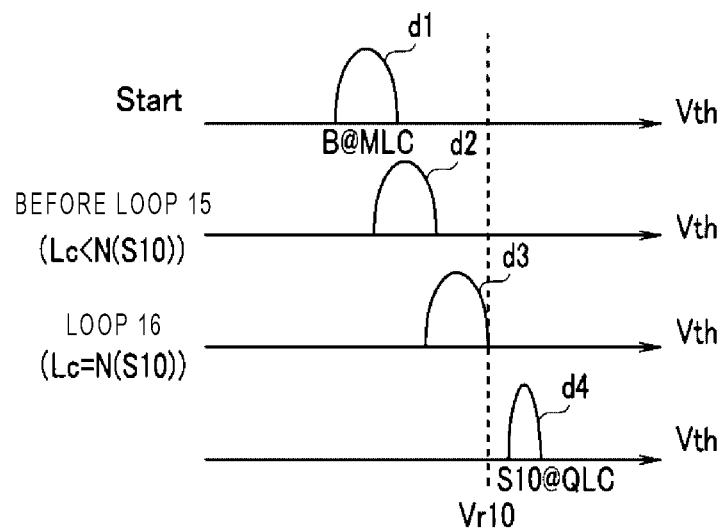
FIG. 26 is a diagram illustrating a variation of a threshold voltage distribution for each loop in the second embodiment.

FIG. 26 is a diagram illustrating a variation of a threshold voltage distribution for each loop. FIG. 26 illustrates a variation of a threshold voltage distribution when the program operation is performed such that the threshold voltage distribution of the level B becomes the threshold voltage distribution of the state S10, and a timing for starting the verify operation.

For example, as illustrated in FIG. 9, the charge of the threshold voltage distribution of the level B becomes any of the states S6, S7, S10, and S11 by the QLC write operation. A correlation exists between the magnitude of the program voltage Vpgm applied during the program operation and the increase amount of the threshold voltage of the memory cell MT. Accordingly, a timing for starting the verify operation for a certain state Sn is determined in association with a loop. That is, a verify operation start loop N(Sn) is set for each state Sn. For example, for the state S10, when the data retention deterioration is not assumed, the verify operation start loop N(S10) that indicates a timing for starting the verify operation for the state S10 is 16, as illustrated in FIG. 25. Unless the data retention deterioration is assumed, the verify operation of the state S10 before the loop 15 becomes unnecessary as illustrated in FIG. 25. When the verify operation of the state S10 is executed from the preset loop N(Sn), the execution of an unnecessary verify operation is prevented, and the desired threshold voltage distribution of the state S10 may be obtained.

In FIG. 25, the verify operation start loop N(S10) at which the verify operation of the state S10 starts is 16. That is, the verify operation for the state S10 is not executed before the loop 15 (when a loop count value Lc indicating a loop that is being executed is less than N(S10)). In FIG. 26, d1 represents the threshold voltage distribution of the level B, and d2 represents the threshold voltage distribution before the loop 15.

The threshold voltage distribution of the state S10 is generated from the threshold voltage distribution of the level B. The threshold voltage distribution of each memory cell MT varies such that the threshold voltage gradually increases as the loop progresses (as the loop count value Lc increases).

Figure 27:
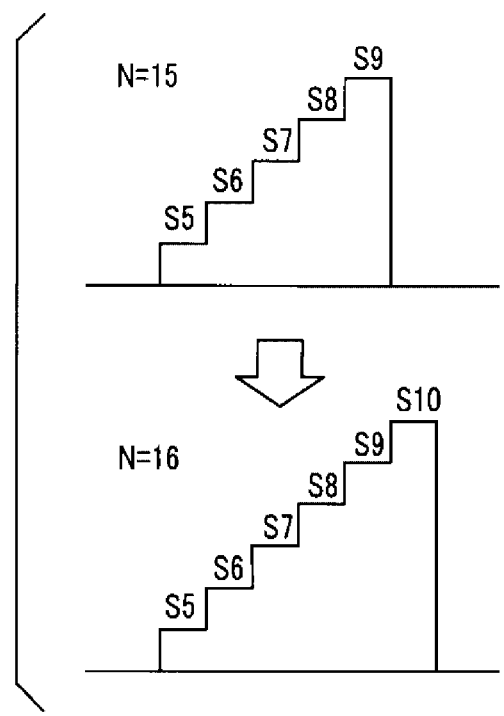
FIG. 27 is a diagram illustrating variations of read voltages during the verify operation in loops 15 and 16 in the second embodiment.

FIG. 27 is a diagram illustrating the variation of the read voltage applied to the selected word line during the verify operation, in the loop 15 (Lc=15) and the loop 16 (Lc=16). According to the table of FIG. 25, in the loop 15 (Lc=15), the verify operation is executed for the states S5 to S9. Similarly, in the loop 16 (Lc=16), the verify operation is executed for the states S5 to S10.

For example, in FIG. 26, when the threshold voltage distribution of the state S10 indicated by d4 is generated from the threshold voltage distribution of the level B indicated by d1, the threshold voltage distribution d2 generated by the program operation before the loop 15 (Lc<N(S10)) does not reach a verify voltage Vr10 indicated by a dashed line (the verify voltage for the state S10). Meanwhile, the threshold voltage distribution d3 generated by the program operation of the loop 16 (Lc=N(S10)) reaches the vicinity of the verify voltage Vr10 indicated by the dashed line. Accordingly, assuming the variation of the threshold voltage distribution illustrated in FIG. 26, the verify operation of the state S10 before the loop 15 is unnecessary, and the verify operation of the state S10 may be executed after the loop 15, so that the desired distribution d4 may be generated as the threshold voltage distribution of the state S10 while omitting the unnecessary verify operation.

That is, when the loop count value Lc indicating a loop that is being executed becomes N(Sn) (N(S10)=16 in the example of FIG. 26), the verify operation for the corresponding state Sn is started. Assuming an ideal state, in the loop before the verify operation start loop N(Sn), the threshold voltage distribution does not reach the verify voltage of the target state (the verify voltage Vr10 indicated by the dashed line) as indicated by d2 in FIG. 26. In the verify operation start loop N(Sn), the threshold voltage distribution partially approaches the verify voltage of the target state as indicated by d3 in FIG. 26. By starting the verify operation from the state indicated by d3 in FIG. 26, the unnecessary verify operation may be omitted, and the narrow distribution indicated by d4 in FIG. 26 may be generated as the threshold voltage distribution of each state.

However, the threshold voltage distribution (e.g., the level B) may shift to a relatively low voltage after the MLC write operation is executed.

Figure 28:
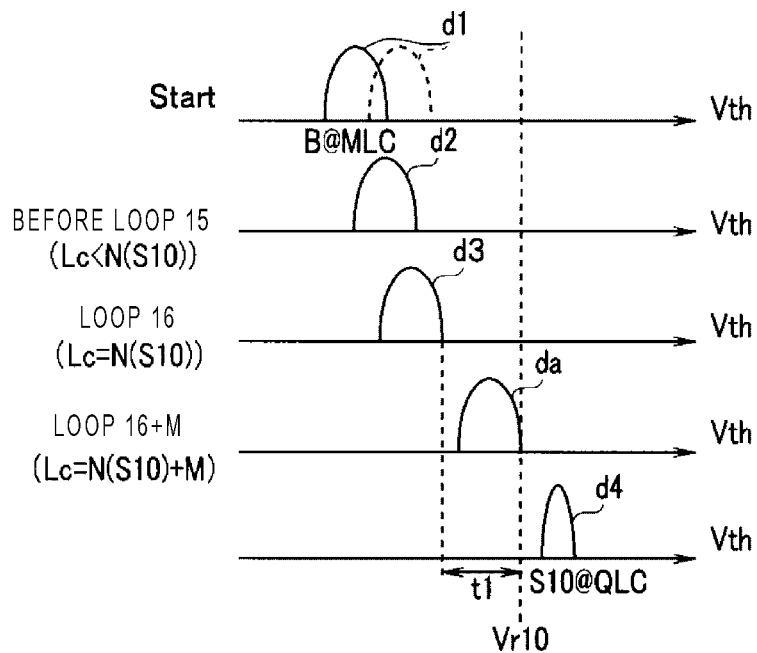
FIG. 28 is a diagram illustrating a variation of a threshold voltage distribution for each loop due to a data retention deterioration in the second embodiment.

FIG. 28 is a diagram illustrating a variation of a threshold voltage distribution for each loop due to the data retention deterioration after the MLC write operation is performed. As illustrated in FIG. 28, when the threshold voltage distribution of the level B changes from the position indicated by a dashed line to the position indicated by a solid line, the threshold voltage distribution d3 generated by, for example, the program operation before the loop 15 does not reach the verify voltage (Vr10) corresponding to the target state (S10), and a threshold voltage distribution da obtained by the program operation of a loop 16+M reaches the vicinity of the verify voltage (Vr10) corresponding to the target state (S10). In this case, the verify operation performed before the loop 16+M is unnecessary, and the time for the entire write operation increases by a verify operation time t1 for the M times.

That is, in a case where the threshold voltage distribution of the MLC data shifts to a relatively low voltage, an unnecessary verify operation may be performed when the verify operation is executed from the verify operation start loop set without assuming the data retention deterioration.

Meanwhile, when the verify operation start loop N(Sn) is set simply assuming that the threshold voltage distribution shifts to a relatively low voltage, an over-programming may be performed in a case where the influence of the data retention deterioration is small.

Figure 29:
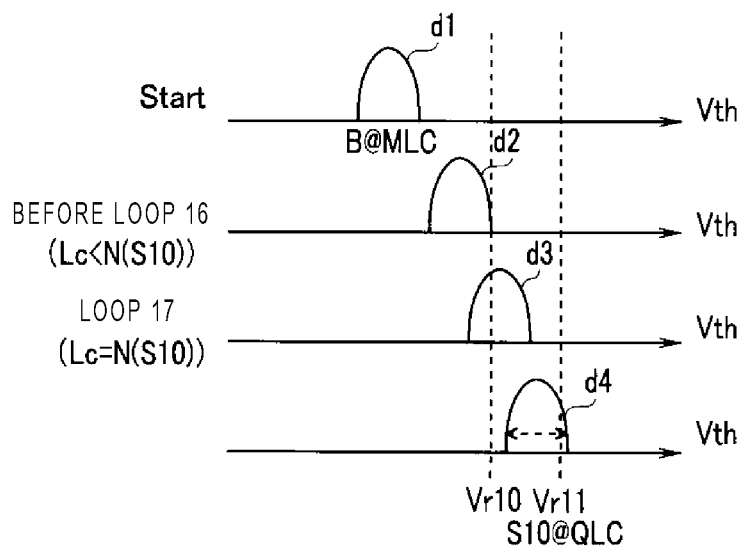
FIG. 29 is a diagram illustrating a variation of a threshold voltage distribution for each loop when a verify operation start loop is set assuming the data retention deterioration in advance.

FIG. 29 is a diagram illustrating a variation of a threshold voltage distribution for each loop when the verify operation start loop N(Sn) is reset to a relatively large value, simply assuming that the threshold voltage distribution shifts to a relatively low voltage. For example, an example may be considered in which the verify operation start loop N(S10) for the state S10 is reset to 17 larger than 16 without assuming the data retention deterioration. Here, when the shift of the threshold voltage distribution to a relatively low voltage due to the data retention deterioration is smaller than assumed, the threshold voltage distribution d2 generated by the program operation of the loop 16 (the original verify operation start loop N(S10)) reaches the vicinity of the verify voltage (Vr10) as illustrated in FIG. 29. The threshold voltage distribution d3 generated by the program operation of the loop 17 (the verify operation start loop N(S10) reset to a large value) partially exceeds the verify voltage (Vr10). Even when the threshold voltage already exceeds the verify voltage, each memory cell MT becomes the target of the program operation unless the memory cell MT is set to the write-inhibited state by the verify operation before the program operation. As a result, the wide distribution indicated by d4 in FIG. 29 may be generated as the threshold voltage distribution of each state. When the threshold voltage distribution reaches the verify voltage of a relatively higher state (or when the number of memory cells MT, in the memory cell group MG, of which threshold voltage already reaches the verify voltage of a relatively higher state increases, and thus, an error correction may not be performed by the ECC circuit 14 of the memory controller 1), the over-programming is more likely to occur.

To address such an issue, in the present embodiment, the verify operation start loop N(Sn) for each state Sn is adjusted according to the shift amount dv of the threshold voltage distribution after the MLC write operation is executed.

Specifically, during the QLC write operation, the Vth tracking is performed for the threshold voltage distribution of data written by the MLC write, and an optimum read voltage is detected. The verify operation start loop for a required state is changed according to the difference between the optimum read voltage obtained by the detection and the initially assumed read voltage (the shift amount dv in FIG. 22). For example, the verify operation start loops of the states S6, S7, S10, and S11 are set to be large by a predetermined amount, according to the shift amount dv of the threshold voltage distribution of the level B, so as to delay the start of the verify operation. That is, when the valley position is lower than the read voltage preset for reading the MLC written data, the sequencer 25 changes the verify operation start loop to delay the start of the verify operation.

As described above, since the MLC read is executed based on the read voltage at which the valley position between the levels is optimum, the reliability of the reading of the MLC written data during the QLC write operation is improved. Further, since the verify operation start loop N(Sn) for each state Sn is changed according to the shift amount dv from a normal read voltage, the unnecessary verify operation is omitted, so that the writing time TPROG may be reduced.

Figure 30:
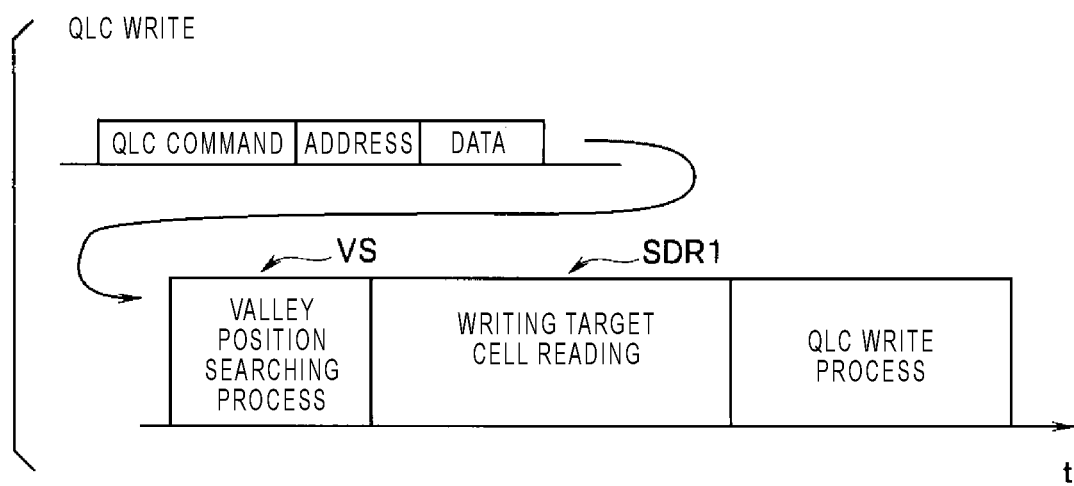
FIG. 30 is a diagram illustrating a command sequence for a QLC write operation (a second write operation) in the second embodiment.

FIG. 30 is a diagram illustrating a command sequence for the QLC write operation.

When the QLC write operation is performed, the sequencer 25 receives the QLC write command.

Further, the sequencer 25 receives an address and data related to the received QLC write command.

After the data are received, the sequencer 25 executes the valley position searching process VS described above for the selected word line WLn. That is, an optimum read voltage for the MLC data is searched.

Subsequently, the sequencer 25 executes a process of reading the MLC written data of each memory cell MT of the selected word line WLn (also referred to as a writing target cell reading process SDR1), by using the optimum read voltage. In the writing target cell reading process SDR1 as well, the reading of the lower page and the reading of the middle page are performed twice.

As described above, during the QLC write operation, when the QLC write command is received, the sequencer 25 executes the valley position searching process VS for searching for the valley position and the data reading process (SDR1) for reading the data written by the MLC write. In the writing target cell reading process SDR1, the reading of the data written by the MLC write operation is performed based on the searched valley position.

Then, the sequencer 25 executes the QLC write operation. In the QLC write operation, the verify operation start loop N(Sn) of each state is adjusted according to the shift amount dv of the read voltage of each level.

Specifically, the sequencer 25 delays the verify operation start loop of at least a part of the states S1 to S15, so as to prevent the execution of an unnecessary verify operation or reduce the number of unnecessary verify operations.

FIG. 31 is a diagram illustrating a relationship between a loop and a state targeted for the verify operation in the write operation, according to the present embodiment. When the verify operation start loop is set to be large by a predetermined amount, the verify operation of the target state is omitted from the preset verify operation start loop to the newly set verify operation start loop. In FIG. 31, each dashed circle indicates the omitted verify operation.

Figure 32:
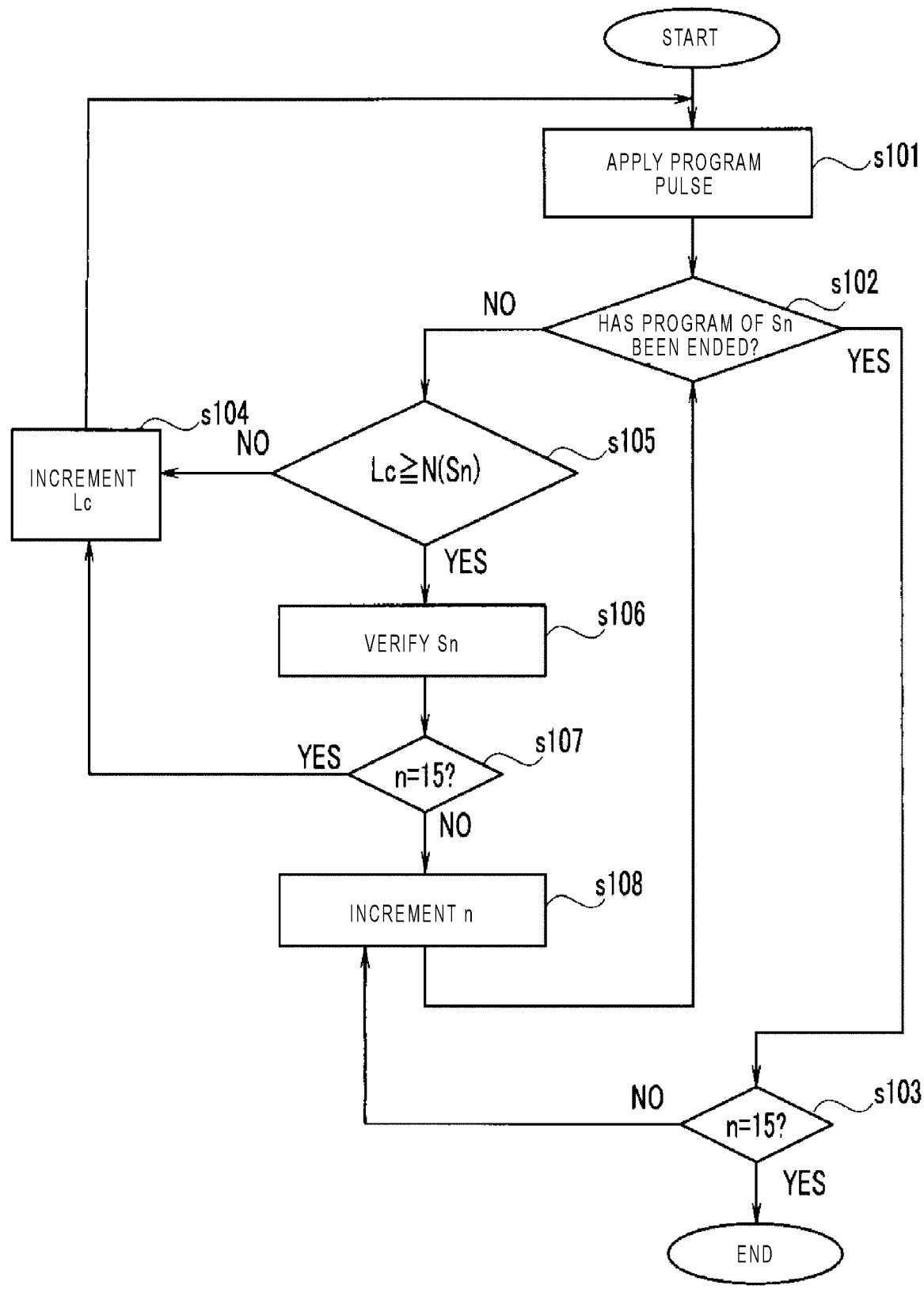
FIG. 32 is a flowchart of the QLC write operation (the second write operation) according to the second embodiment.

FIG. 32 is a flowchart of the QLC write operation. The "Lc" indicates the loop count value corresponding to a loop that is being executed. For example, in the first loop, Lc is 1. In the flowchart, the loop count value Lc before the QLC write operation is executed is set to 0.

The sequencer 25 increments the loop count value Lc by 1, and applies a predetermined program pulse to the selected word line WL (step 101). Hereinafter, the "step" may also be referred to as "s". For example, "step 101" may also be referred to as "s101".

The sequencer 25 determines whether the program of each state Sn which is the target of the verify operation in the corresponding loop has been ended (s102). The "n" refers to any of 1 to 15 of the states. For example, in the loop 1, the state S1 is the target of the verify operation. In the loop 3, the states S1 and S2 are the targets of the verify operation. In the loop 20, the states S8, S9, S10, S11, and S12 are the targets of the verify operation.

When it is determined that the program for each state Sn which is the target of the verify operation in the corresponding loop has been ended (s102: YES), the sequencer 25 determines whether the program of the state S15 has been ended (i.e., n=15?) (S103).

When it is determined that the program for the state S15 has been ended (s103; YES), the sequencer 25 ends the process of FIG. 32.

When it is determined that the program for the state S15 has not been ended (s103; NO), the sequencer 25 increments "n" by 1 (s108), and then, executes the process of s102.

When it is determined that the program for each state Sn which is the target of the verify operation in the corresponding loop has not been ended (s102: NO), the sequencer 25 determines whether the loop count value Lc (the loop that is being executed) is equal to or more than the verify operation start loop N(Sn) of each state Sn (s105). That is, it is determined whether it is necessary to execute the verify operation of the state Sn in the corresponding loop.

When it is determined that the loop count value Lc (the loop that is being executed) is not equal to or more than the verify operation start loop N(Sn) of each state Sn (s105: NO), the sequencer 25 increments the loop count value Lc by 1 (s104). After s104, the sequencer 25 outputs a predetermined program pulse to the selected word line WL, and executes the program operation of the next loop (s101).

When it is determined that the loop count value Lc (the loop that is being executed) is equal to or more than the verify operation start loop N(Sn) of the state Sn (s105: YES), the sequencer 25 executes the verify operation for the corresponding state Sn (s106).

After s106, the sequencer 25 determines whether the execution of the verify operation of the state S15 has been completed (i.e., n=15?) (s107).

When it is determined that the execution of the verify operation of the state S15 has been completed (s107: YES), the sequencer 25 executes s104. At this time, "n" is initialized in s104.

When it is determined that the execution of the verify operation of the state S15 has not been completed (s107: NO), the sequencer 25 increments "n" by 1 (s108), and then, executes the process of s102.

Figure 33:
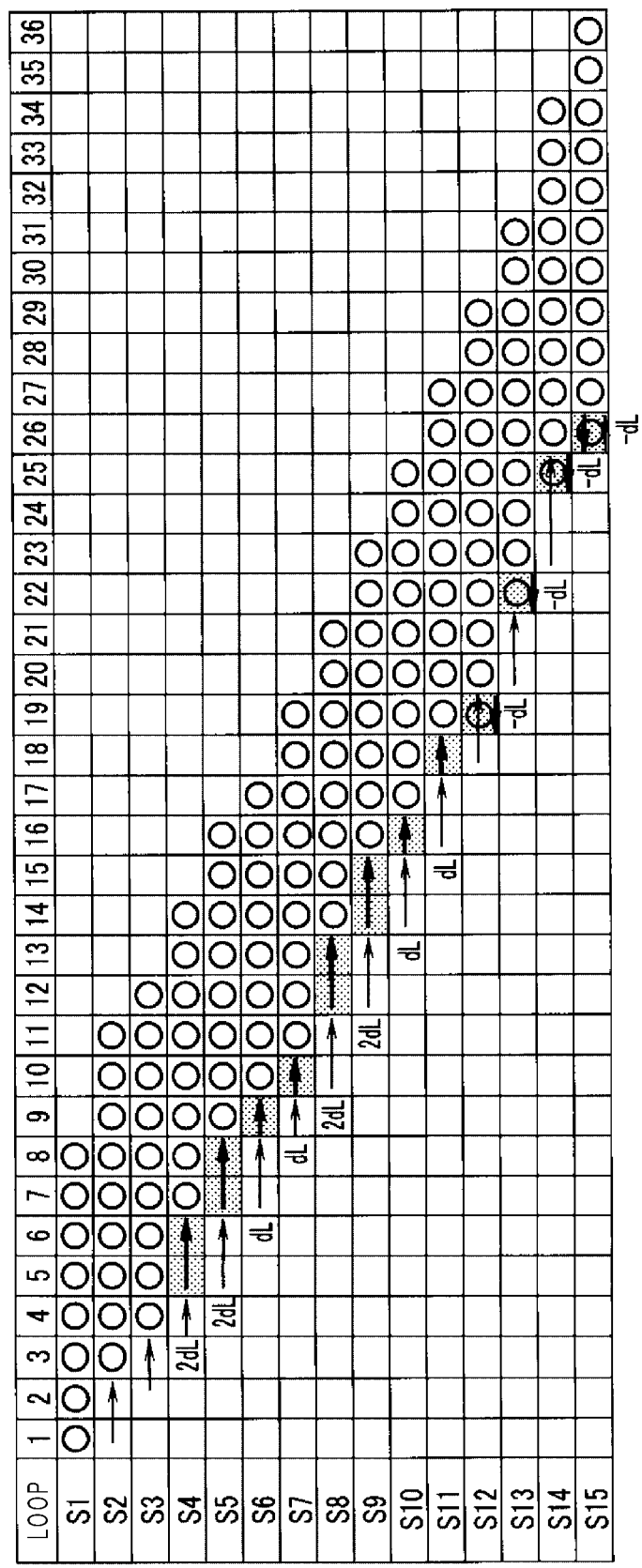
FIG. 33 is a diagram illustrating a relationship between a loop and a verify operation as a result of adjusting a verify operation start timing of each state according to a shift amount of a read voltage of each level using the Vth tracking read according to the second embodiment.

FIG. 33 is a diagram illustrating a relationship between a loop and a verify operation which is a result of adjusting the verify operation start loop N(Sn) of each state according to the shift amount dv of the read voltage of each level through the Vth tracking read.

In FIG. 33, the verify operation start loop N(Sn) is changed for the shaded states. For example, the verify operation start loop N(S4) of the state S4 is omitted by the offset amount 2dL. That is, the verify operation of the state S4 is not performed in the loops 5 and 6. Similarly, the verify operation start loop N(S10) of the state S10 is omitted by the offset amount dL. Further, each of the verify operation start loops N(S12) to N(S15) of the states S12 to S15 is added by the offset amount dL.

As described above, according to the present embodiment, since the execution of an unnecessary verify operation may be prevented, the time required for writing data may be reduced while avoiding the adverse effect on the threshold voltage distribution.

In particular, since the information of the valley position detected by the Vth tracking read of the MLC data is acquired immediately before the QLC write operation so as to determine the verify operation start loop, the verify operation is executable the optimum number of times without executing an unnecessary verify operation.

Further, in each of the embodiments described above, the nonvolatile memory 2 is a QLC NAND memory capable of storing 4 bits per memory cell. However, the nonvolatile memory 2 may be a NAND memory of 2 bit/Cell, 3 bit/Cell, or 5 bit/Cell. Further, multi-bit data may be written by performing the write operation three or more times. For example, for a 3-bit/Cell NAND memory, data of one bit may be written in a first write operation, and data of the remaining two bits may be written in a second write operation. For example, for a 5-bit/Cell NAND memory, data of two bits may be written in a first write operation, and data of the remaining three bits may be written in a second write operation, or data of three bits may be written in the first write operation, and data of the remaining two bits may be written in the second write operation. Further, for example, for the 5-bit/Cell NAND memory, data of one bit may be written in a first write operation, data of two bits of the remaining bits may be written in a second write operation, and data of the remaining two bits may be written in a third write operation.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method to control a semiconductor memory device including:
   a memory string having a first memory cell connected to a first word line and a bit line and a second memory cell adjacent to the first memory cell and connected to a second word line and the bit line; and
   a sense amplifier circuit connected to the bit line, the sense amplifier circuit including:
      a plurality of first latch circuits, a number of the first latch circuits corresponding to a number of bits of multi-bit-data writable into the first memory cell;
      a second latch circuit; and
      a third latch circuit in which data to be transferred into and data transferred out of the plurality of first latch circuits and the second latch circuit is temporarily stored, the method comprising:
   performing a multi-bit-data writing with respect to each of the first and second memory cells, wherein the multi-bit-data writing includes, in order:
      a first programming to program first data stored in a part of the first latch circuits to the first memory cell;
      the first programming to program second data stored in the second latch circuit to the second memory cell;
      a reading of the second data from the second memory cell programmed by the first programming, the second data read from the second memory cell being stored in the second latch circuit;
      a second programming to program the first memory cell after programmed by the first programming;
      a setting of a verify voltage to be applied to the first word line, the verify voltage being varied depending on a bit value of the first data stored in the part of the first latch circuits, and a bit value of the second data that has been read from the second memory cell and stored in the second latch circuit; and
      a verification of the first memory cell programmed by the second programming, applying the verify voltage to the first word line.

2. The method according to claim 1, wherein
   the multi-bit-data writing further includes a reading of the first data from the first memory cell before the second programming, and
   the setting of the verify voltage is varied depending on the first data, which has been read from the first memory cell and stored in the part of the first latch circuits.

3. The method according to claim 2, wherein the verify voltage is varied based on a difference between the first data and the second data.

4. A semiconductor memory device comprising:
   a memory cell connected to a word line; and
   a control circuit configured to perform a multi-bit-data writing with respect to the memory cell in accordance with iteration of a loop process, the control circuit comprising a loop counter that counts a loop count incremented in accordance with execution of the loop process, a verify voltage being incremented in accordance with the loop count, wherein the multi-bit-data writing includes, in order:
      a first programming to program the memory cell;
      a reading of the memory cell;
      a second programming to program the memory cell; and
      a verification of data programmed in the memory cell, wherein
   the control circuit is configured to:
      during the reading, determine an optimum read voltage to be applied to the word line to read data from the memory cell,
      start the second programing at a first timing corresponding to a first loop count counted by the loop counter and the verification at a second timing corresponding to a second loop count, following the first loop count, counted by the loop counter using the verify voltage corresponding to the second loop count, and
      vary the second timing based on the optimum read voltage.

5. The semiconductor memory device according to claim 4, wherein the control circuit is configured to determine a voltage difference between the optimum read voltage and a predetermined read voltage to be applied to the word line, and vary the second timing based on the voltage difference.

6. The semiconductor memory device according to claim 5, wherein the control circuit is configured to delay the second timing when the optimum read voltage is less than the predetermined read voltage.

7. The semiconductor memory device according to claim 5, wherein the control circuit is configured to delay the second timing by a first amount when the voltage difference is a first voltage amount, and delay the second timing by a second amount greater than the first amount when the voltage difference is a second voltage amount greater than the first amount.

8. The semiconductor memory device according to claim 4, wherein the control circuit is configured to, during the reading, read data from the memory cell using the optimum read voltage.

* * * * *